United States Patent
Suzuki et al.

(10) Patent No.: US 10,206,280 B2
(45) Date of Patent: Feb. 12, 2019

(54) MOUNTING STRUCTURE, ULTRASONIC DEVICE, ULTRASONIC PROBE, ULTRASONIC APPARATUS AND ELECTRONIC APPARATUS

(71) Applicant: Seiko Epson Corporation, Tokyo (JP)

(72) Inventors: Hironori Suzuki, Chino (JP); Hiroshi Matsuda, Chino (JP); Koji Ohashi, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/710,094

(22) Filed: Sep. 20, 2017

(65) Prior Publication Data

US 2018/0084642 A1    Mar. 22, 2018

(30) Foreign Application Priority Data

Sep. 21, 2016 (JP) ................................. 2016-184362

(51) Int. Cl.
| | | |
|---|---|---|
| *H05K 7/00* | (2006.01) | |
| *H05K 1/11* | (2006.01) | |
| *H05K 1/18* | (2006.01) | |
| *B06B 1/06* | (2006.01) | |

(52) U.S. Cl.
CPC .................. *H05K 1/11* (2013.01); *B06B 1/06* (2013.01); *B06B 1/0644* (2013.01); *H05K 1/18* (2013.01)

(58) Field of Classification Search
CPC ............... B06B 1/06; H05K 1/11; H05K 1/18
See application file for complete search history.

(56) References Cited

U.S. PATENT DOCUMENTS

| | | | |
|---|---|---|---|
| 2004/0174092 A1* | 9/2004 | Iwata | H03H 3/04 310/324 |
| 2007/0001200 A1* | 1/2007 | Imai | H01L 24/11 257/288 |
| 2009/0051042 A1 | 2/2009 | Neishi | |
| 2010/0163869 A1* | 7/2010 | Yang | H01L 22/30 257/48 |
| 2015/0179371 A1* | 6/2015 | Hashimoto | H01H 1/0036 200/329 |
| 2016/0149117 A1* | 5/2016 | Wang | H01L 41/0478 310/334 |
| 2016/0205779 A1* | 7/2016 | Nakagawa | H01R 13/2414 174/251 |

FOREIGN PATENT DOCUMENTS

| | | | |
|---|---|---|---|
| JP | 2007-180166 A | | 7/2007 |
| JP | 2007180166 | * | 7/2007 |
| JP | 2008-103584 A | | 5/2008 |
| JP | 2009-049229 A | | 3/2009 |

* cited by examiner

*Primary Examiner* — Yuriy Semenenko
(74) *Attorney, Agent, or Firm* — Harness, Dickey & Pierce, P.L.C.

(57) ABSTRACT

A mounting structure includes a first substrate on which an elastic core section is provided, a conductive film that is provided over the first substrate from an upper part of the core section, and a second substrate on which a wiring portion connected to the conductive film on the core section is provided, in which the conductive film has a notch that partially exposes an end part of a surface of the core section which is in contact with the first substrate.

20 Claims, 17 Drawing Sheets

MOUNTING STRUCTURE, ULTRASONIC DEVICE, ULTRASONIC PROBE, ULTRASONIC APPARATUS AND ELECTRONIC APPARATUS

BACKGROUND

1. Technical Field

The present invention relates to a mounting structure, ultrasonic device, ultrasonic probe, ultrasonic apparatus, and an electronic apparatus.

2. Related Art

In a case where an electric component is mounted on a circuit substrate, there is a mounting method in which a wiring on the circuit substrate side is electrically connected to a wiring on the electric component side via a bump electrode (for example, refer to JP-A-2007-180166).

JP-A-2007-180166 discloses the electric component in which an electronic element (functional element) such as an IC chip and a bump electrode connected to the functional element are formed on a substrate. Above all, the bump electrode includes a wiring (conductive film) connected to an electrode pad extracted from the functional element, and a resin protrusion (core section) which can be elastically deformed. The conductive film is extracted from the functional element to the core section formed at a peripheral edge of the substrate, crosses the core section, and partially covers a surface of the core section. On the other hand, the circuit substrate is a substrate on which a liquid crystal panel is formed, and electrode terminals are formed in regions other than a region in which liquid crystal elements are disposed. The bump electrode on the electric component side is brought into contact with the electrode terminal on the circuit substrate side, and is elastically deformed, and thus the bump electrode and the electrode terminal are electrically connected to each other.

However, in the configuration disclosed in JP-A-2007-180166, there is concern that a crack may occur in the conductive film at a boundary between the substrate on the electric component side and the core section. In other words, the conductive film provided on the core section is deformed according to elastic deformation of the core section. On the other hand, the conductive film provided on the substrate is fixed to the substrate. Thus, a difference occurs between deformation amounts of the conductive film on the core section and the substrate, and thus stress concentrates on the conductive film provided at the boundary position between the substrate and the core section. There is concern that a crack may occur in the conductive film or the conductive film may be ruptured due to the concentration of the stress, and thus there is a problem in that the reliability (connection reliability) of electrical connection between substrates is reduced.

SUMMARY

An advantage of some aspects of the invention is to provide a mounting structure, an ultrasonic device, an ultrasonic probe, an ultrasonic apparatus, and an electronic apparatus as an application example and an embodiment capable of improving connection reliability between substrates.

A mounting structure according to an application example of the invention includes a first substrate on which an elastic core section is provided; a conductive film that is provided over the first substrate from an upper part of the core section; and a second substrate on which a wiring portion connected to the conductive film on the core section is provided, in which the conductive film has a notch that partially exposes an end part of a surface of the core section which is in contact with the first substrate.

In the application example, the first substrate is provided with the core section and the conductive film. Above all, the conductive film has the notch which is provided over the first substrate from an upper part of the core section, and partially exposes the end part of the surface (bottom) of the core section which is in contact with the first substrate. In other words, the notch is formed at a position where the conductive film overlaps a boundary between the core section and the first substrate, that is, a position on which stress easily concentrates, and thus the stress can be alleviated. Therefore, it is possible to prevent the occurrence of a crack in the conductive film, and also to improve connection reliability.

The conductive film on the core section can be easily deformed during elastic deformation of the core section, and thus it is possible to alleviate stress acting on the conductive film.

The notch overlaps the boundary between the core section and the first substrate, and exposes a part of the boundary. Consequently, the exposed portion on which the conductive film is not formed in the core section can be easily deformed during elastic deformation of the core section. Therefore, it is possible to reduce an amount of the deformed conductive film due to elastic deformation, and thus to alleviate stress acting on the conductive film.

In the mounting structure according to the application example, it is preferable that the conductive film has an outer peripheral edge which extends from the core section to the first substrate, and the notch is provided at a position where the outer peripheral edge overlaps the end part, and is depressed from the outside of the conductive film inward when viewed from a thickness direction of the conductive film.

In the application example with this configuration, the conductive film has the outer peripheral edge which extends from the core section to the first substrate. In other words, the core section has an exposed part which is located further outward than the outer peripheral edge of the conductive film and is exposed from the conductive film. The exposed part is more easily elastically deformed than a portion on which the conductive film is provided. In the application example, since the notch is provided to be depressed inward at a part of the outer peripheral edge, and is located around the exposed part, it is possible to alleviate stress acting on the conductive film during elastic deformation.

In the mounting structure according to the application example, it is preferable that the outer peripheral edge has a first edge part and a second edge part which are linear forming the notch, and the first edge part and the second edge part have an intersection at a position overlapping the end part, and are separated from the end part as a distance from the intersection becomes longer along the end part.

In the application example with this configuration, the notch is formed of the linear first edge part and second edge part. The first edge part and the second are separated from the end part as a distance from the intersection becomes longer along the end part. In other words, a distance between the first edge part and the end part and a distance between the second edge part and the end part increase as a distance from the intersection becomes longer. In this configuration, a width of the notch increases as a distance from the intersection becomes longer, and thus the core section is easily deformed. Therefore, an amount of the deformed core section can be reduced as a distance from the intersection becomes shorter, and thus it is possible to further alleviate stress acting on the conductive film due to elastic deformation of the core section.

Here, the first edge part and the second edge part being linear indicates that, for example, the first and the second edge part are substantially linear when viewed from a thickness direction of the conductive film, and also includes a configuration in which the first edge part and the second edge part are slightly curved along the core section or the first substrate.

In the mounting structure according to the application example, it is preferable that the notch has an arc shape.

Here, stress easily concentrates on a bent part at which the outer peripheral edge of the conductive film is bent, due to elastic deformation of the core section, when viewed from a thickness direction of the conductive film. In the application example with this configuration, the notch has an arc shape, and does not have a bent part on which stress easily concentrates. Thus, it is possible to prevent the occurrence of a crack in the conductive film due to concentration of stress on a part of the outer peripheral edge of the conductive film.

In the mounting structure according to the application example, it is preferable that the outer peripheral edge has an edge part forming the notch, and the edge part has a bent part which is bent along the core section on the core section when viewed from a thickness direction of the conductive film.

In the application example with this configuration, the edge part forming the notch has the bent part, and the bent part is located on the core section. Here, in the conductive film, stress easily concentrates on a position (overlapping part) where the edge part overlaps the end part. However, in the application example, the outer peripheral edge has the bent part on which stress easily concentrates in addition to the overlapping part. Thus, stress can be distributed to the overlapping part and the bent part, and thus it is possible to reduce stress concentration.

In the mounting structure according to the application example, it is preferable that the conductive film has a plurality of the notches.

In the application example with this configuration, since the conductive film has a plurality of notches, the stress can be further alleviated, and thus connection reliability can be further improved.

In the mounting structure according to the application example, it is preferable that the conductive film has a pair of outer peripheral edges which have a width dimension smaller than a width dimension of the core section when viewed from a thickness direction of the first substrate, and extend from the core section to the first substrate on both sides in a width direction of the conductive film, and the notches are provided at positions where the pair of outer peripheral edges overlaps the end part, and are depressed from the outside of the conductive film inward when viewed from a thickness direction of the conductive film.

In the application example with this configuration, the conductive film has a width dimension smaller than that of the core section, and the notches are formed at the outer peripheral edges on both sides thereof in a width direction. In this configuration, the core section has an exposed part which is exposed from the conductive film on both sides thereof in the width direction. The notches are also provided on both sides thereof in the width direction. In this configuration, the core section can be elastically deformed on both sides thereof in the width direction. Therefore, a deformation amount of the core section can be distributed, and thus stress acting on the conductive film can also be distributed.

In the mounting structure according to the application example, it is preferable that the core section has an equal-thickness part whose dimension is the same in a thickness direction of the first substrate along one direction, and the conductive film is provided along an intersection direction intersecting the one direction when viewed from the thickness direction of the first substrate, and a part of the conductive film is provided on the equal-thickness part.

In the application example with this configuration, the core section has the equal-thickness part having the same thickness dim, and the equal-thickness part is provided along one direction. The conductive film is provided along the intersection direction intersecting the one direction when viewed from the thickness direction of the first substrate, and a part of the conductive film is provided on the equal-thickness part. In this configuration, force from the wiring portion substantially uniformly acts on the core section and the conductive film overlapping the connection region in the thickness direction. Consequently, it is possible to reduce a difference between deformation amounts of the core section and the conductive film in the connection region. Therefore, it is possible to alleviate stress acting on the conductive film in the connection region or the vicinity thereof.

In the mounting structure according to the application example, it is preferable that the conductive film has a second notch around a connection region with the wiring portion.

In the application example with this configuration, the second notch is located around the connection region. Here, the core section receives pressing force at the position overlapping the connection region connected to the wiring portion so as to be elastically deformed. At this time, there is concern that stress may concentrate on the conductive film at a boundary between the connection region and the peripheral region due to a difference in the deformation amount between the connection region and the peripheral region, and thus a crack may occur in the conductive film. In contrast, the second notch located in the peripheral region can alleviate the stress acting on the conductive film at the boundary, and can thus prevent the occurrence of a crack in the conductive film.

In the mounting structure according to the application example, it is preferable that the core section has a top part which is located on an opposite side to the first substrate, and overlaps the connection region, and an inclined part which is inclined toward the first substrate as a distance from the top part becomes longer, the conductive film has an outer peripheral edge which extends from the core section to the first substrate, and at least a part of the outer peripheral edge is located on the inclined part, and the second notch is provided at a position where the outer peripheral edge overlaps the inclined part, and is depressed from the outside of the conductive film inward when viewed from a thickness direction of the conductive film.

In the application example with this configuration, the core section has the inclined part which is inclined toward the first substrate from the top part, and at least a part of the outer peripheral edge of the conductive film is located on the inclined part. In other words, the core section is exposed outside the outer peripheral edge of the conductive film, and is thus more easily deformed than the location where the conductive film is provided. Therefore, stress easily concentrates on the outer peripheral edge of the conductive film due to a difference in a deformation amount of the core section between the inside and the outside of the outer peripheral edge of the conductive film. The stress also easily concentrates on the outer peripheral edge of the conductive film due to the above-described difference in a deformation amount between the connection region and the peripheral region thereof. In contrast, the second notch is formed to be depressed inward at the outer peripheral edge located on the inclined part. Thus, it is possible to alleviate stress acting on the conductive film, and thus to prevent the occurrence of a crack in the conductive film.

An ultrasonic device according to an application example of the invention includes a first substrate on which an elastic core section is provided; a conductive film that is provided over the first substrate from an upper part of the core section; a second substrate on which a wiring portion connected to the conductive film on the core section is provided; and an ultrasonic transducer provided on at least one of the first substrate and the second substrate, in which the conductive film has a notch that partially exposes an end part of a surface of the core section which is in contact with the first substrate.

In this application example, the first substrate is provided with the core section and the conductive film. Above all, the conductive film has the notch which is provided over the first substrate from an upper part of the core section, and partially exposes the end part of the surface (bottom) of the core section which is in contact with the first substrate. In the application example configured as mentioned above, in the same manner as in the above-described application example, since stress acting on the conductive film can be alleviated, it is possible to prevent the occurrence of a crack in the conductive film, and also to improve connection reliability.

An ultrasonic probe according to an application example of the invention includes a first substrate on which an elastic core section is provided; a conductive film that is provided over the first substrate from an upper part of the core section; a second substrate on which a wiring portion connected to the conductive film on the core section is provided; an ultrasonic transducer provided on at least one of the first substrate and the second substrate; and a casing in which the first substrate and the second substrate are stored, in which the conductive film has a notch that partially exposes an end part of a surface of the core section which is in contact with the first substrate.

In this application example, the first substrate is provided with the core section and the conductive film. Above all, the conductive film has the notch which is provided over the first substrate from an upper part of the core section, and partially exposes the end part of the surface (bottom) of the core section which is in contact with the first substrate. In the application example configured as mentioned above, in the same manner as in the above-described application example, since stress acting on the conductive film can be alleviated, it is possible to prevent the occurrence of a crack in the conductive film, and also to improve connection reliability.

An ultrasonic apparatus according to an application example of the invention includes a first substrate on which an elastic core section is provided; a conductive film that is provided over the first substrate from an upper part of the core section; a second substrate on which a wiring portion connected to the conductive film on the core section is provided; an ultrasonic transducer provided on at least one of the first substrate and the second substrate; and a control unit that controls the ultrasonic transducer, in which the conductive film has a notch that partially exposes an end part of a surface of the core section which is in contact with the first substrate.

In this application example, the first substrate is provided with the core section and the conductive film. Above all, the conductive film has the notch which is provided over the first substrate from an upper part of the core section, and partially exposes the end part of the surface (bottom) of the core section which is in contact with the first substrate. In the application example configured as mentioned above, in the same manner as in the above-described application example, since stress acting on the conductive film can be alleviated, it is possible to prevent the occurrence of a crack in the conductive film, and also to improve connection reliability.

An electronic apparatus according to an application example of the invention includes a first substrate on which an elastic core section is provided; a conductive film that is provided over the first substrate from an upper part of the core section; a second substrate on which a wiring portion connected to the conductive film on the core section is provided; a functional element provided on at least one of the first substrate and the second substrate; and a control unit that controls the functional element, in which the conductive film has a notch that partially exposes an end part of a surface of the core section which is in contact with the first substrate.

In this application example, the first substrate is provided with the core section and the conductive film. Above all, the conductive film has the notch which is provided over the first substrate from an upper part of the core section, and partially exposes the end part of the surface (bottom) of the core section which is in contact with the first substrate. In the application example configured as mentioned above, in the same manner as in the above-described application example, since stress acting on the conductive film can be alleviated, it is possible to prevent the occurrence of a crack in the conductive film, and also to improve connection reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a description will be made of an ultrasonic measurement apparatus according to a first embodiment with reference to the drawings.

Figure 1:
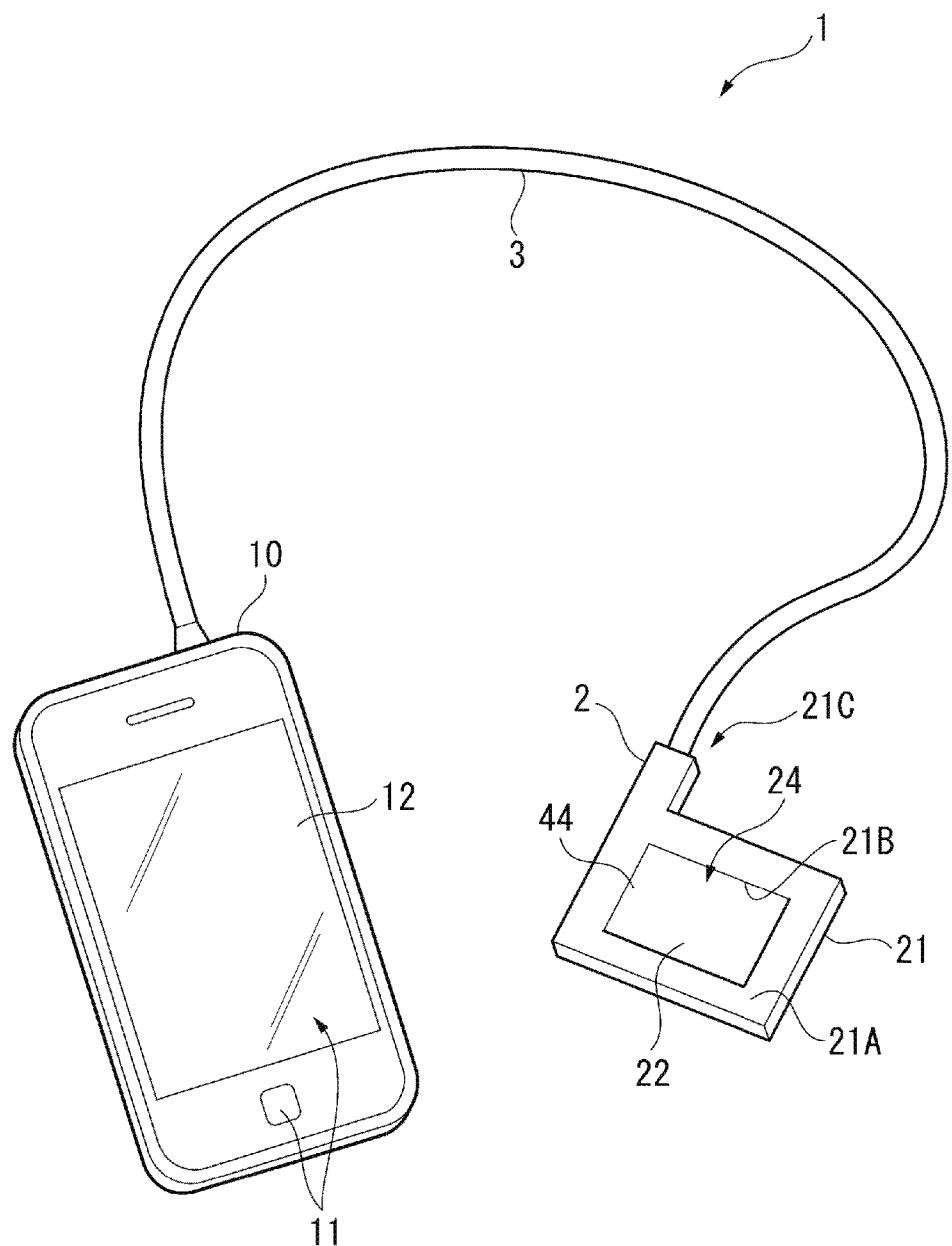
FIG. 1 is a perspective view illustrating a schematic configuration of an ultrasonic measurement apparatus according to a first embodiment.
Figure 2:
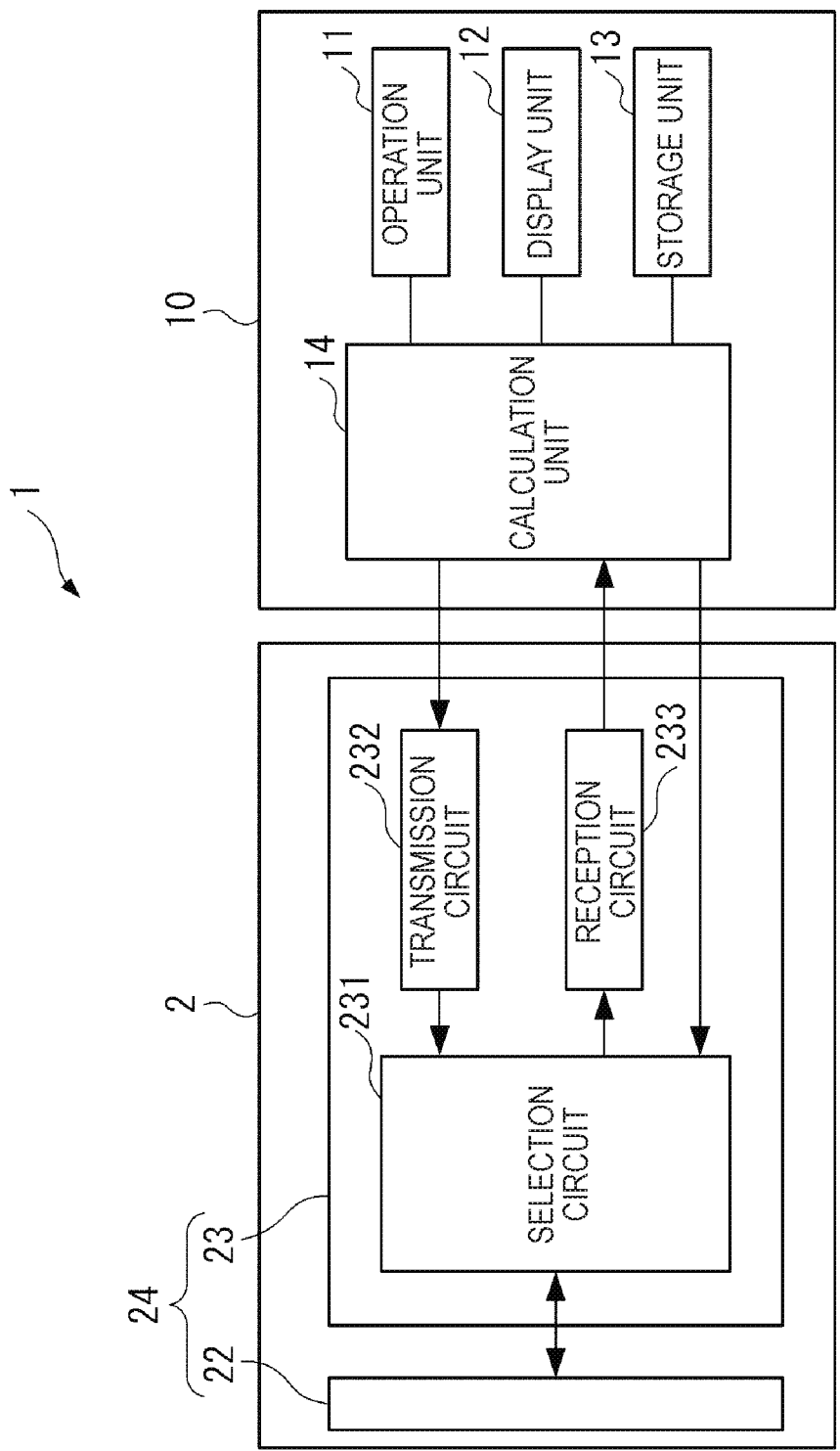
FIG. 2 is a block diagram illustrating a schematic configuration of the ultrasonic measurement apparatus according to the first embodiment.

FIG. 1 is a perspective view illustrating a schematic configuration of an ultrasonic measurement apparatus 1. FIG. 2 is a block diagram illustrating a schematic configuration of the ultrasonic measurement apparatus 1.

As illustrated in FIG. 1, the ultrasonic measurement apparatus 1 corresponds to an ultrasonic apparatus, and includes an ultrasonic probe 2, and a control device 10 which is electrically connected to the ultrasonic probe 2 via a cable 3.

In the ultrasonic measurement apparatus 1, the ultrasonic probe 2 is brought into close contact with a surface of a living body (for example, a human body), and ultrasonic waves are transmitted into the living body from the ultrasonic probe 2. Ultrasonic waves reflected at an organ of the living body are received by the ultrasonic probe 2, and, for example, an internal tomographic image of the living body is acquired, or a state (for example, a blood flow) of an organ of the living body is measured, on the basis of received signals.

Configuration of Control Device

The control device 10 corresponds to a control unit, and is configured to include, for example, an operation unit 11, a display unit 12, a storage unit 13, and a calculation unit 14, as illustrated in FIG. 2. The control device 10 may employ, for example, a terminal device such as a tablet terminal, a smart phone, or a personal computer, and may be a dedicated terminal device for operating the ultrasonic probe 2.

The operation unit 11 is a user interface (UI) for a user operating the ultrasonic measurement apparatus 1, and may be formed of, for example, a touch panel provided on the display unit 12, operation buttons, a keyboard, and a mouse.

The display unit 12 is formed of, for example, a liquid crystal display, and displays an image.

The storage unit 13 stores various programs or various pieces of data for controlling the ultrasonic measurement apparatus 1.

The calculation unit 14 is formed of, for example, a calculation circuit such as a central processing unit (CPU) and a storage circuit such as a memory. The calculation unit 14 reads various programs stored in the storage unit 13 and executes the programs so as to perform control for processes of generating and outputting a transmission signal to be transmitted to the ultrasonic probe 2, and to perform control for various processes (for example, setting of a frequency of a reception signal or gain setting) of causing the ultrasonic probe 2 to receive ultrasonic waves.

Configuration of Ultrasonic Probe

The ultrasonic probe 2 includes a casing 21, an ultrasonic device 22 stored in the casing 21, and a circuit substrate 23 provided with a driver circuit and the like for controlling the ultrasonic device 22 (refer to FIG. 2). An ultrasonic sensor 24 is formed of the ultrasonic device 22 and the circuit substrate 23, and the ultrasonic sensor 24 forms an ultrasonic module.

Configuration of Casing

As illustrated in FIG. 1, the casing 21 is formed, for example, in a rectangular box shape in a plan view, and a sensor window 21B is provided on one surface (sensor surface 21A) which is orthogonal to a thickness direction, and a part of the ultrasonic device 22 is exposed. A passing hole 21C of the cable 3 is provided at a part of the casing 21 (a side surface in the example illustrated in FIG. 1), and the cable 3 is connected to the circuit substrate 23 inside the casing 21 through the passing hole 21C. A gap between the cable 3 and the passing hole 21C is filled with, for example, a resin material, and thus water resistance is ensured.

In the present embodiment, a configuration example in which the ultrasonic probe 2 and the control device 10 are connected to each other via the cable 3 is described, but is not limited thereto, for example, the ultrasonic probe 2 and the control device 10 may be connected to each other through wireless communication, and various constituent elements of the control device 10 may be provided in the ultrasonic probe 2.

Configuration of Circuit Substrate

The circuit substrate 23 is provided with a driver circuit or the like which is bonded to the ultrasonic device 22 so as to control the ultrasonic device 22. As illustrated in FIG. 2, the circuit substrate 23 includes a selection circuit 231, a transmission circuit 232, and a reception circuit 233.

The selection circuit 231 switches between connection states such as transmission connection for connecting the ultrasonic device 22 to the transmission circuit 232 and reception connection for connecting the ultrasonic device 22 to the reception circuit 233 under the control of the control device 10.

The transmission circuit 232 outputs a transmission signal for transmitting ultrasonic waves to the ultrasonic device 22 via the selection circuit 231 when a connection state is switched to the transmission connection under the control of the control device 10.

The reception circuit 233 outputs a received signal which is input from the ultrasonic device 22 via the selection circuit 231, to the control device 10 when a connection state is switched to the reception connection under the control of the control device 10. The reception circuit 233 is configured to include, for example, a low-noise amplification circuit, a voltage controlled alternator, a programmable gain amplifier, a low-pass filter, and an A/D converter, performs various signal processes such as conversion of the received signal into a digital signal, removal of a noise component, and amplification to a desired signal level, and then outputs the processed received signal to the control device 10.

Configuration of Ultrasonic Device

Figure 3:
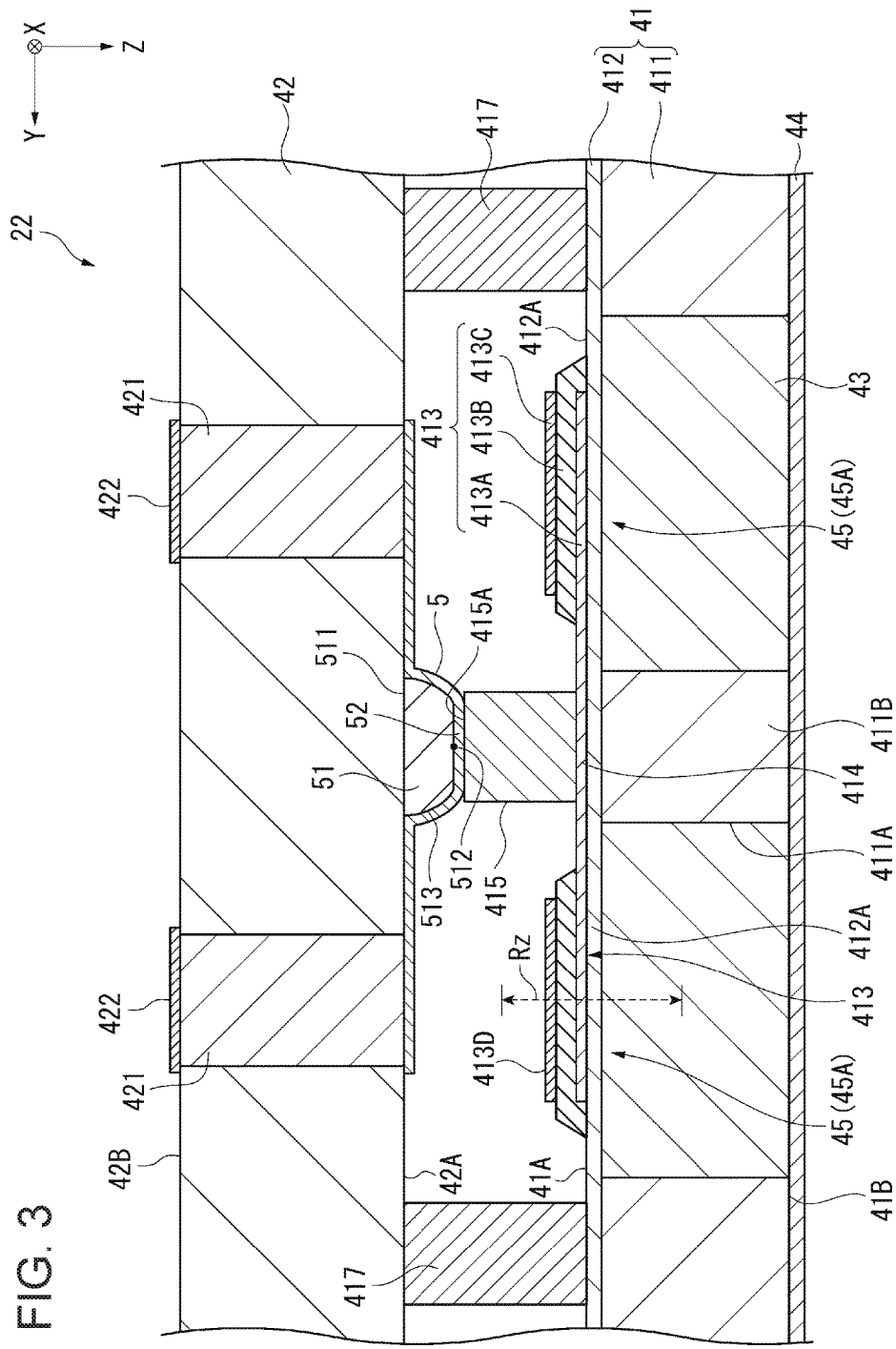
FIG. 3 is a sectional view illustrating a schematic configuration of an ultrasonic device according to the first embodiment.
Figure 4:
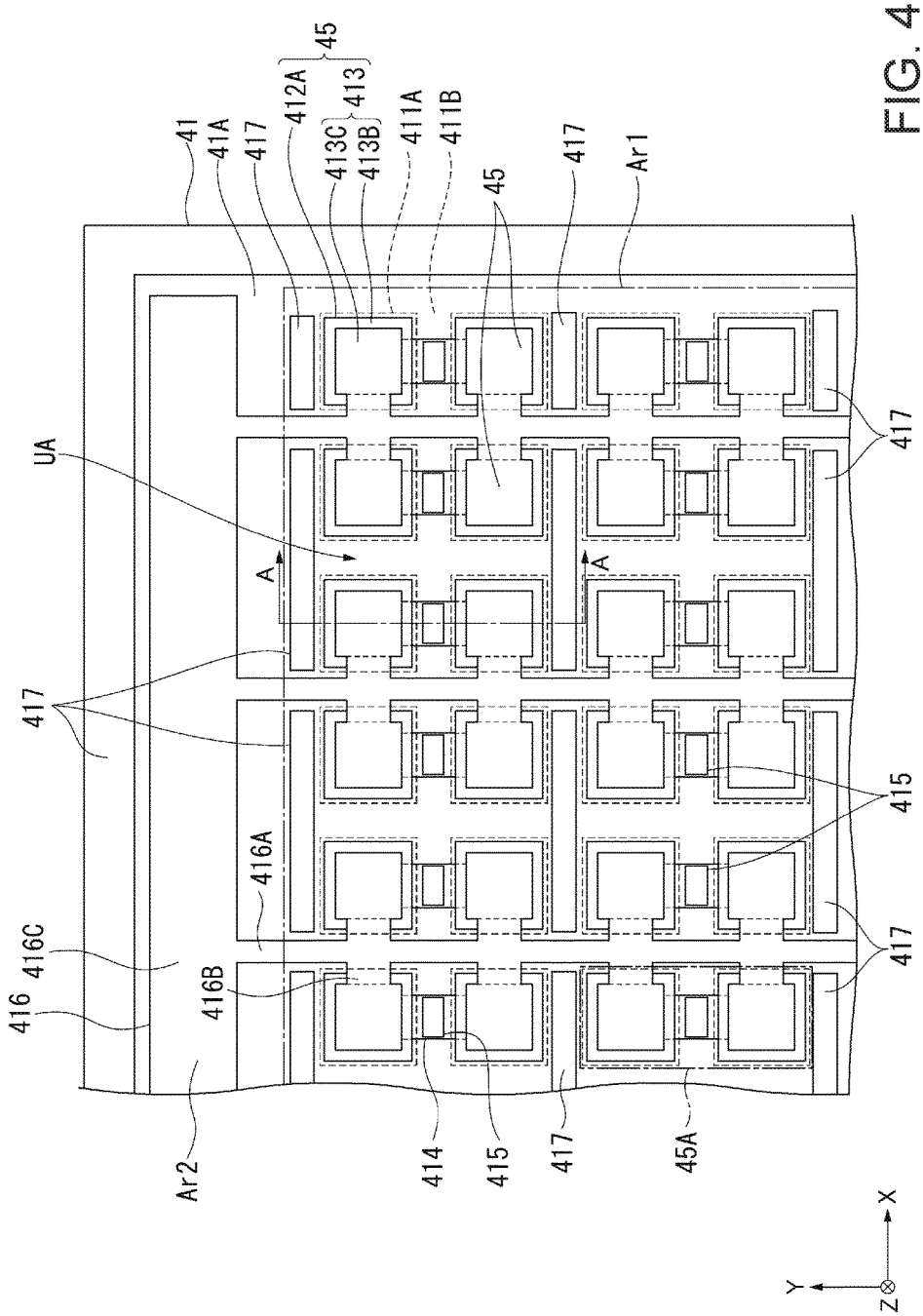
FIG. 4 is a plan view illustrating a schematic configuration of an element substrate in the ultrasonic device according to the first embodiment.
Figure 5:
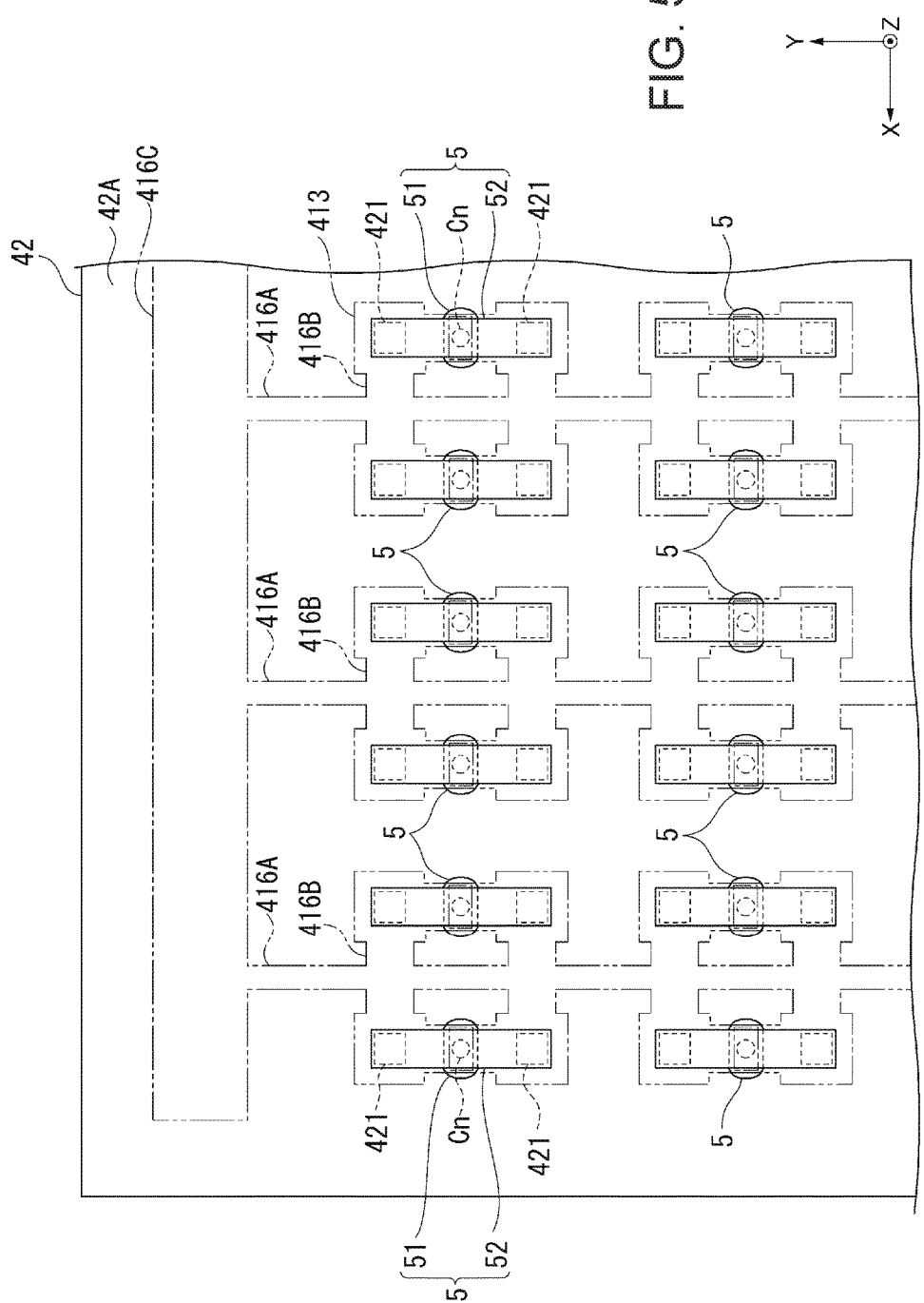
FIG. 5 is a plan view illustrating a schematic configuration of a sealing plate in the ultrasonic device according to the first embodiment.

FIG. 3 is a sectional view of the ultrasonic device 22. FIG. 4 is a plan view in which an element substrate 41 of the ultrasonic device 22 is viewed from a sealing plate 42 side. FIG. 5 is a plan view schematically illustrating an ultrasonic transducer 45 viewed from a protection film 44 side. FIG. 3 is a sectional view of the ultrasonic device 22 taken along the line A-A in FIG. 4.

As illustrated in FIG. 3, the ultrasonic device 22 is configured to include the element substrate 41, the sealing plate 42, an acoustic layer 43, and the protection film 44. Above all, as illustrated in FIG. 3, the element substrate 41 and the sealing plate 42 are electrically connected to each other via a conduction portion 5 of the sealing plate 42 corresponding to a first substrate and a wiring portion 415 of the element substrate 41 corresponding to a second substrate.

Here, in the following description, a surface of the element substrate 41 facing the sealing plate 42 will be referred to as a rear surface 41A, and a surface opposite to the rear surface 41A will be referred to as an operation surface 41B. A surface of the sealing plate 42 facing the element substrate 41 will be referred to as an inner surface 42A, and an opposite surface to the inner surface 42A will be referred to as an outer surface 42B. Thickness directions of the element substrate 41 and the sealing plate 42 substantially match a Z direction.

Configuration of Element Substrate

The element substrate 41 includes, as illustrated in FIG. 3, a substrate main body portion 411, and a vibration film 412 laminated on the substrate main body portion 411. As illustrated in FIG. 4, the element substrate 41 is provided with piezoelectric elements 413, a lower electrode connection line 414, a wiring portion 415, an upper electrode extraction line 416, and bonding portions 417 on the vibration film 412 on the sealing plate 42 side. The ultrasonic transducer 45 which transmits and receives an ultrasonic wave is formed of a flexible portion 412A and the piezoelectric element 413 in a vibration region of the vibration film 412 among the constituent elements.

As illustrated in FIG. 4, a plurality of ultrasonic transducers 45 which transmit and receive ultrasonic waves are disposed in a matrix along an X axis and a Y direction intersecting (in the present embodiment, orthogonal to) the X axis in an array region Ar1 located at the center of the element substrate 41. An ultrasonic array UA is formed of the plurality of ultrasonic transducers 45.

The substrate main body portion 411 is, for example, a semiconductor substrate such as Si. An opening 411A corresponding to each ultrasonic transducer 45 is provided in the array region An in the substrate main body portion 411. The respective openings 411A are separated by a wall portion 411B. Each opening 411A is closed by the vibration film 412 provided on the sealing plate 42 side (−Z side).

The vibration film 412 is formed of, for example, $SiO_2$, or a laminate of $SiO_2$ and $ZrO_2$, and is provided to cover the entire −Z side of the substrate main body portion 411. In the vibration film 412, a portion closing the opening 411A forms the flexible portion 412A which is elastically deformed. A thickness dimension (thickness) of the vibration film 412 is a sufficiently small thickness dimension (thickness) relative to the substrate main body portion 411. In a case where the substrate main body portion 411 is made of Si, and the vibration film 412 is made of $SiO_2$, for example, the substrate main body portion 411 is subject to oxidation treatment, and thus the vibration film 412 having a desired thickness dimension (thickness) can be easily formed. In this case, the substrate main body portion 411 is etched with the vibration film 412 of $SiO_2$ as an etching stopper, and thus the opening 411A can be easily formed.

Each piezoelectric element 413 is provided on the flexible portion 412A of the vibration film 412 closing each opening 411A. A single ultrasonic transducer 45 is formed of the flexible portion 412A and the piezoelectric element 413. The piezoelectric element 413 is formed of a laminate of a lower electrode 413A, a piezoelectric film 413B, and an upper electrode 413C.

The lower electrode 413A or the upper electrode 413C is configured to include a layer made of one or two or more conductive materials. As such a conductive material, for example, electrode materials such as Au, Al, Cu, Ir, Pt, IrOx, Ti, TiW, and TiOx may be used. In the present embodiment, for example, the lower electrode 413A is formed by laminating a TiW layer (50 nm) and a Cu layer (100 nm) in this order on the vibration film 412.

The piezoelectric film 413B is formed by using, for example, a transition metal oxide having a perovskite structure, more specifically, lead zirconate titanate containing Pb, Ti, and Zr.

A rectangular wave voltage with a predetermined frequency is applied between the lower electrode 413A and the upper electrode 413C in the ultrasonic transducer 45, and thus an ultrasonic wave can be transmitted by causing the flexible portion 412A located in the opening region of the opening 411A to vibrate along the Z direction. If the flexible portion 412A vibrates due to a reflected ultrasonic wave from a target object, a potential difference occurs in the upper and lower portions of the piezoelectric film 413B. Therefore, the received ultrasonic wave can be detected by detecting the potential difference occurring between the lower electrode 413A and the upper electrode 413C.

In the present embodiment, as illustrated in FIG. 4, among the plurality of ultrasonic transducers 45 disposed along the X direction and the Y direction, two ultrasonic transducers 45 arranged in the Y direction form an ultrasonic transducer group 45A which is a single transmission/reception channel. In other words, the ultrasonic array UA is formed as a two-dimensional array in which a plurality of ultrasonic transducer groups 45A which are transmission/reception channels are disposed along the X direction and the Y direction.

The lower electrodes 413A of the respective ultrasonic transducers 45 forming the ultrasonic transducer groups 45A are connected to each other via the lower electrode connection line 414. The lower electrode connection line 414 is integrally formed with each lower electrode 413A. In other words, the lower electrode connection line 414 is formed by laminating a TiW layer (50 nm) and a Cu layer (100 nm) in the same manner as, for example, the lower electrode 413A. The lower electrode connection line 414 may be provided separately from the lower electrode 413A.

The upper electrode extraction line 416 is connected to each upper electrode 413C of the ultrasonic transducer 45. The upper electrode extraction line 416 is made of a conductive material, and includes a plurality of extraction wiring portions 416A, connection portions 416B connecting the extraction wiring portions 416A to the upper electrodes 413C, and a connection terminal portion 416C disposed in a wiring region Ar2.

As illustrated in FIG. 4, each of the extraction wiring portions 416A is provided between columns of the plurality of ultrasonic transducers 45 disposed along the Y direction. The extraction wiring portion 416A is connected to the upper electrode 413C of each ultrasonic transducer 45 via the connection portion 416B.

The connection terminal portion 416C is formed in the wiring region Ar2 of the outer peripheral portion of the element substrate 41, and is connected to the extraction wiring portions 416A. The connection terminal portion 416C is connected to a ground circuit (not illustrated) of the circuit substrate 23 via a wiring member, and is set to a reference potential (for example, 0 potential). In other words, the upper electrode 413C is a communication electrode to which a reference potential is applied.

The bonding portion 417 bond the element substrate 41 to the sealing plate 42 configured as described above. The bonding portions 417 are disposed at positions along the outer edge of the element substrate 41 or positions along the ultrasonic transducers 45. For example, as illustrated in FIG. 4, the bonding portions 417 are disposed at positions overlapping the wall portions 411B of the rear surface 41A along the X direction.

The bonding portion 417 is formed by using a material which can bond the element substrate 41 to the sealing plate 42, for example, various adhesives or a resin material such as a photosensitive resin material (photoresist). In the present embodiment, the bonding portion 417 is formed by using a photosensitive resin material. Consequently, the bonding portion 417 can be formed at a desired position in a desired shape.

Configuration of Wiring Portion

The wiring portion 415, which has conductivity, is disposed at a position which is different from that of the ultrasonic transducer 45 of the rear surface 41A is electrically connected to the ultrasonic transducer 45 via the lower electrode connection line 414. Specifically, the wiring portion 415 has a substantially rectangular shape in a plan view viewed from the Z direction, protrudes toward the sealing plate 42 from the lower electrode connection line 414 disposed at a position overlapping the wall portion 411B, and is electrically connected to the conduction portion 5 which will be described later. In other words, the lower electrode 413A of each ultrasonic transducer 45 is electrically connected to the conduction portion 5 via the lower electrode connection line 414 and the wiring portion 415. A single wiring portion 415 is provided in each of the plurality of ultrasonic transducer groups 45A. A mounting structure is configured to include at least the element substrate 41, the wiring portion 415, the sealing plate 42, and the conduction portion 5.

As illustrated in FIG. 3, an end surface (hereinafter, also referred to as an end section 415A) of the wiring portion 415 on the sealing plate 42 side is located further toward the sealing plate 42 side than an end surface (hereinafter, also referred to as a Z side end surface 413D) on the −Z side of the piezoelectric element 413 of the ultrasonic transducer 45. The end section 415A is located further toward the sealing plate 42 side than a vibration range (refer to an arrow Rz in FIG. 3) of the ultrasonic transducer 45 in the Z direction. Consequently, it is possible to prevent interference between a member (for example, the conduction portion 5) provided on the sealing plate 42 side and the ultrasonic transducer 45. For example, even if the ultrasonic transducer 45 is driven so that the Z side end surface 413D of the piezoelectric element 413 is moved toward the sealing plate 42 side, interference between the piezoelectric element 413 and the conduction portion 5 can be prevented.

The wiring portion 415 is formed by using, for example, a conductive material such as a metal material, or a resin material containing conductive fillers. For example, the wiring portion 415 is formed by depositing a metal material on the lower electrode connection line 414 according to an electroplating method.

A planar shape of the wiring portion 415 in a plan view viewed from the Z direction is not limited to a rectangular shape, and may be a circular shape, an elliptical shape, and various polygonal shapes.

Configuration of Sealing Plate

The sealing plate 42 illustrated in FIGS. 3 and 5 is formed of, for example, a semiconductor substrate, and is bonded to the element substrate 41 via the bonding portions 417 so as to reinforce the strength of the element substrate 41. A material or a thickness of the sealing plate 42 influences frequency characteristics of the ultrasonic transducer 45, and is thus preferably set on the basis of a center frequency of transmitted and received ultrasonic waves. The sealing plate 42 is provided with the conduction portion 5, a through electrode 421, and a lower electrode wire 422.

Configuration of Conduction Portion

Figure 6:
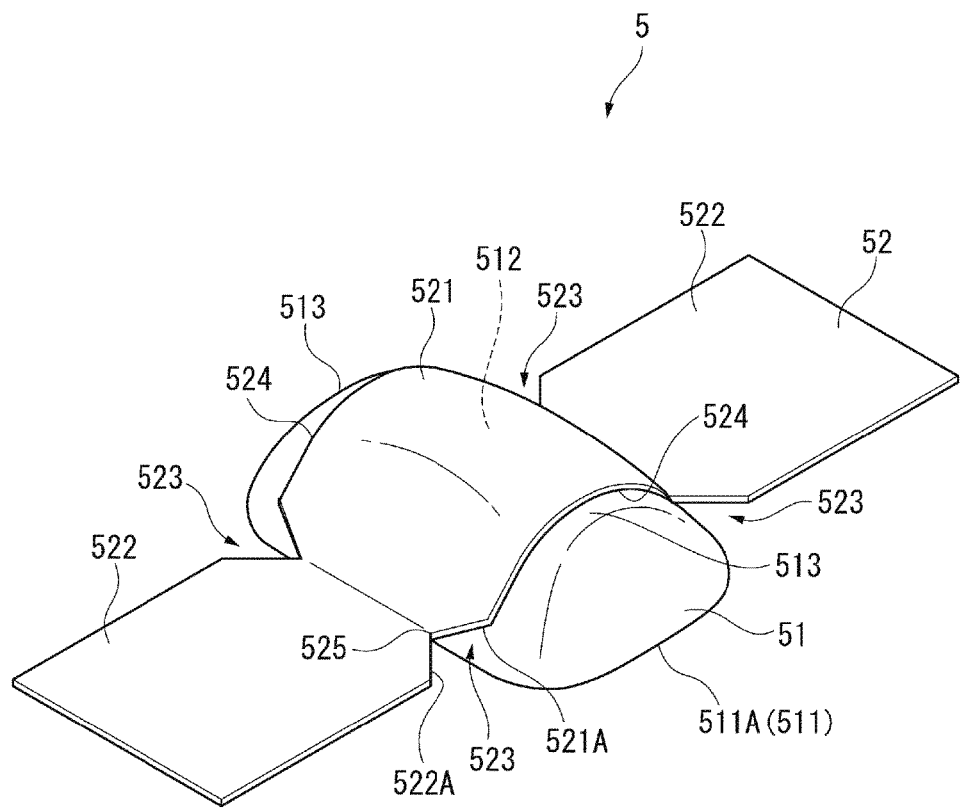
FIG. 6 is a perspective view illustrating a schematic configuration of a conduction portion in the ultrasonic device according to the first embodiment.

FIG. 6 is a perspective view illustrating a schematic configuration of the conduction portion 5.

The conduction portion 5 illustrated in FIGS. 3, 5 and 6 is provided on the inner surface 42A of the sealing plate 42, and is in close contact with the wiring portion 415 provided on the element substrate 41 so as to be electrically connected thereto. The conduction portion 5 includes a resin section 51 and a conductive film 52 which covers a part of the resin section 51 and is electrically connected to the through electrode 421.

The resin section 51, which corresponds to a core section, is provided at a process overlapping the wiring portion 415 on the inner surface 42A, and protrudes toward the element substrate 41 from the inner surface 42A, as illustrated in FIG. 3. The resin section 51 is made of an elastic resin material, and is formed in a substantially trapezoidal shape (a state in which corners of a trapezoidal are rounded).

As illustrated in FIG. 6, the resin section 51 has a surface (bottom) 511 (refer to FIG. 3) in contact with the inner surface 42A, a top part 512 opposite side to the bottom 511, and an inclined part 513 between the bottom 511 and top part 512.

The bottom 511 is formed so that an end part 511A which is a boundary with the inner surface 42A is a substantially rectangular shape in a plan view in the Z direction.

The top part 512 is a position where a dimension of the resin section 51 in the Z direction is the maximum in the surface of the resin section 51 on the +Z side before the resin section 51 is elastically deformed (before contact with the wiring portion 415). In the present embodiment, for example, the top part 512 is the substantially center of the resin section 51 in a plan view in the Z direction.

The inclined part 513 is inclined to the inner surface 42A side from the top part 512 toward the end part 511A. In other words, the resin section 51 before being elastically deformed has a decreasing dimension in the Z direction from the top part 512 toward the end part 511A in a plan view in the Z direction.

The resin section 51 is formed by thermally melting a resin material disposed on the inner surface 42A, and may be formed in a substantially hemisphere shape according to the kind of resin material, or a temperature condition in thermal melting.

A photosensitive resin material (photoresist) may be used as a material forming the resin section 51. In this case, the resin section 51 may be formed in a desired shape at a desired position. As a material forming the resin section 51, not only a photosensitive resin material, but also various elastic resin materials, for example, polyimide resin, acrylic resin, phenol resin, epoxy resin, silicone resin, and modified polyimide resin may be used.

The conductive film 52 crosses over the resin section 51 along the Y direction, and is provided to cover a part of the resin section 51. The conductive film 52 has a coating section 521 on the resin section 51, an extraction section 522 on the inner surface 42A of the sealing plate 42, and a notch 523 which partially exposes the end part 511A of the resin section 51. An outer peripheral edge 524 of the conductive film 52 on the ±X sides is formed from the resin section 51 over the sealing plate 42. A thickness of the conductive film 52 is made sufficiently smaller than a thickness of the resin section 51, and thus the resin section 51 and the conductive film 52 can be elastically deformed.

The coating section 521 is provided to cover a part of the resin section 51. In other words, the coating section 521 is provided to cross over the resin section 51 along the Y direction when viewed from the thickness direction (Z direction) of the sealing plate 42, and a dimension thereof in the X direction is smaller than that of the resin section 51. In other words, the coating section 521 is provided over a part of the inclined part 513 from the top part 512 along the X direction, and the outer peripheral edge 524 is located on the inclined part 513.

The extraction section 522 continues to both ends of the coating section 521 on the ±Y sides (that is, edges of the bottom 511 on ±Y sides) so as to be extracted to the formation position of the through electrode 421, and is thus connected to the through electrode 421 (refer to FIG. 5).

The notch 523 is provided over the coating section 521 and the extraction section 522 at the position where the boundary between the coating section 521 and the extraction section 522 overlaps the outer peripheral edge 524. The notch 523 is depressed from the outside of the conductive film 52 inward (that is, along the X direction) when viewed from the thickness direction (for example, the Z direction) of the conductive film 52. These notches 523 expose parts of the end parts 511A which are boundaries (edge parts of the bottom 511 on the ±Y side) between the resin section 51 and the sealing plate 42.

In the present embodiment, the notches 523 are provided at four locations such as both sides of the conductive film 52 in the X direction (width direction) and both sides of the resin section 51 in the Y direction.

Here, the notch 523 in the present embodiment is formed in a substantially triangular shape by linear first edge part 521A and second edge part 522A which are parts of the outer peripheral edge 524. The first edge part 521A is a part of the outer peripheral edge 524 on the coating section 521 side, and the second edge part 522A is a part of the outer peripheral edge 524 on the extraction section 522 side. The first edge part 521A and the second edge part 522A have an intersection 525 overlapping the end part 511A.

The notch 523 has an increasing width as becoming distant from the intersection 525 along the end part 511A. In other words, the first edge part 521A is inclined with respect to the end part 511A so as to be separated from the end part 511A and the sealing plate 42 as a distance from the intersection 525 becomes longer along the end part 511A. Consequently, an amount of the resin section 51 to be exposed increases as a distance from the intersection 525 becomes longer.

The second edge part 522A is inclined with respect to the end part 511A so as to be separated from the end part 511A as a distance from the intersection 525 becomes longer along the end part 511A. Consequently, the second edge part 522A of the extraction section 522 is separated from the coating section 521 as a distance from the intersection 525 becomes longer.

Here, the substantially linear first edge part 521A also includes a configuration in which the first edge part 521A is slightly curved along the surface of the resin section 51. Similarly, the substantially linear second edge part 522A also includes a configuration in which the second edge part 522A is slightly curved along the sealing plate 42.

As a conductive material forming the conductive film 52, Au, Ag, TiW, Cu, Ni, Pd, Al, Cr, Ti, W, NiCr, or a lead-free solder may be used. In the present embodiment, for example, the conductive film 52 is formed by laminating a TiW layer (50 nm) and an Au layer (100 nm) in this order on the inner surface 42A.

As illustrated in FIG. 3, the conduction portion 5 is in pressure contact with the end section 415A. In other words, when the sealing plate 42 is bonded to the element substrate 41, the +Z side end part of the conduction portion 5 is brought into pressure contact with the end section 415A, and thus the resin section 51 and the coating section 521 forming the conduction portion 5 are elastically deformed so as to come into close contact with (electrically connected to) the end section 415A. Consequently, the conductive film 52 is biased toward the wiring portion 415 side by the restoring force of the elastically deformed resin section 51 and the coating section 521, and thus it is possible to improve the reliability of electrical connection between the conduction portion 5 and the wiring portion 415.

Figure 7:
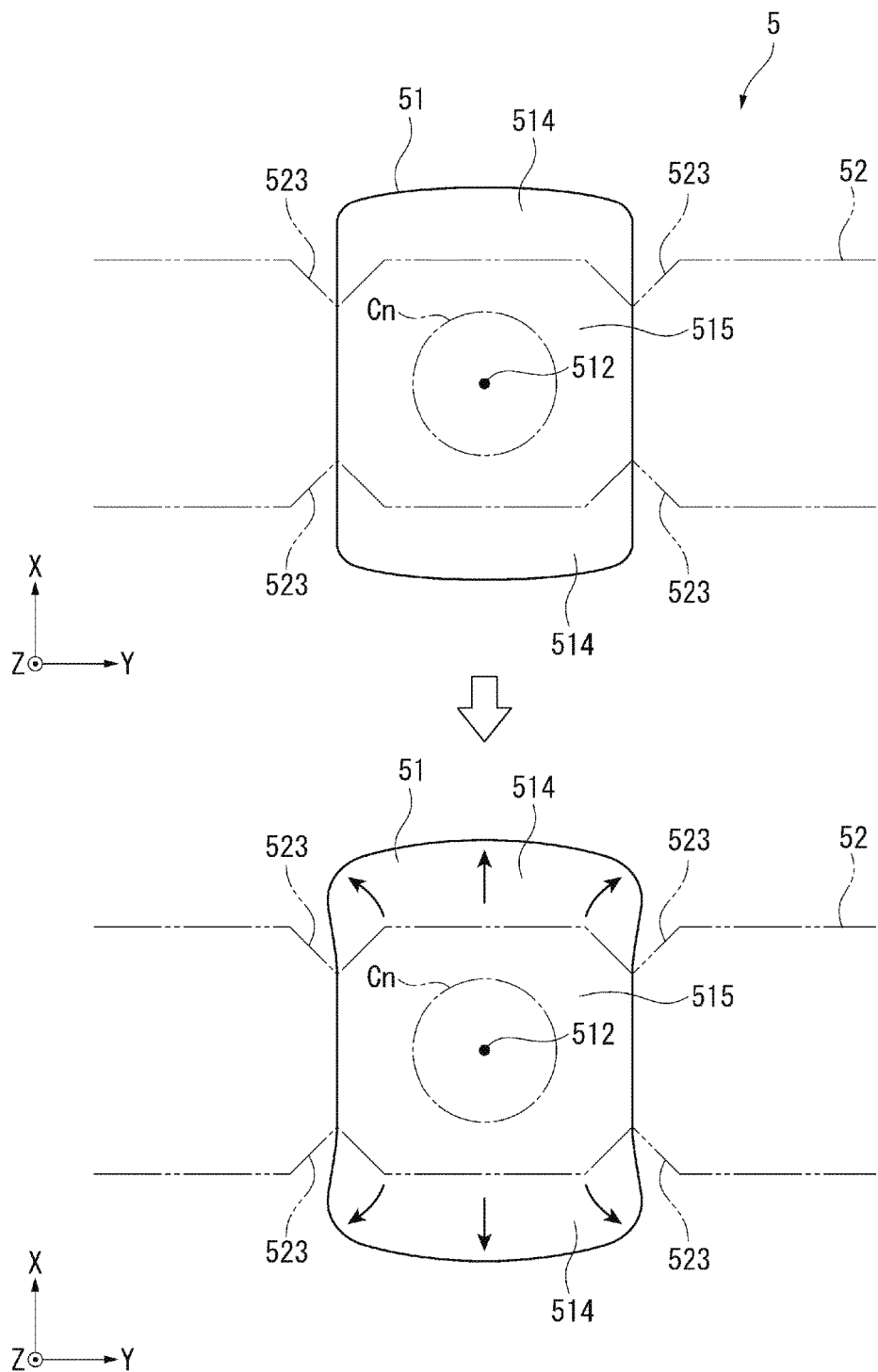
FIG. 7 is a plan view schematically illustrating the conduction portion in the ultrasonic device according to the first embodiment.

FIG. 7 is a schematically illustrating a state in which the resin section 51 is elastically deformed.

Here, when a connection region Cn of the conduction portion 5 is connected to the wiring portion 415, the resin section 51 is elastically deformed as a result of a region (a region including the top part 512) overlapping the connection region Cn being pressed toward the −Z side. In this case, as illustrated in a lower part in FIG. 7, an amount of the deformed resin section 51 becomes larger in an X side end part 514 at both ends thereof which are not coated with the coating section 521 than in a central part 515 which is coated with the coating section 521 and is thus relatively hardly deformed. Thus, in a case where the notch 523 is not formed, stress concentrates on the end parts on the ±X sides at the boundaries between the coating section 521 deformed along with the resin section 51, and the extraction section 522 fixed to the sealing plate 42. There is concern that a crack may occur in the conductive film 52, and, further, the conductive film 52 may be ruptured, due to such concentration of the stress. In contrast, the notch 523 is formed around the X side end part 514 in which an amount of the deformed resin section 51 becomes large, that is, at the outer peripheral edge 524. Thus, it is possible to prevent the concentration of the stress on the conductive film 52 due to deformation of the resin section 51 and thus to suppress the occurrence of a crack in the conductive film 52.

A size (that is, a dimension in the X direction or an amount of the exposed resin section 51) of the notch 523 maybe set as appropriate depending on an amount of the deformed resin section 51.

Configuration of Through Electrode

As illustrated in FIGS. 3 and 5, a pair of through electrodes 421 are provided at positions with the resin section 51 interposed therebetween along the Y direction, and is, for example, a Si through electrode (Through-silicon via: TSV), or a conductive material filling a through hole. The lower electrode wire 422 is individually formed with respect to each through electrode 421 on the outer surface 42B of the sealing plate 42. The lower electrode wire 422 is connected to the through electrode 421, and is connected to the circuit substrate 23 via a wiring (not illustrated) formed along the outer surface 42B. At least one through electrode 421 may be formed with respect to a single conduction portion 5, and three or more through electrodes may be formed. A position where the through electrode 421 is disposed is not limited to the illustrated example, and may be formed on, for example, the +X side or −X side of the resin section 51.

Configurations of Acoustic Layer and Protection Film

As illustrated in FIG. 3, the acoustic layer 43 fills the opening 411A.

The protection film 44 is provided on the element substrate 41 and the acoustic layer 43, so as to protect the element substrate 41 and the acoustic layer 43. As illustrated in FIG. 1, the protection film 44 is exposed to the outside from the sensor window 21B of the casing 21, and is brought into contact with a living body surface during ultrasonic measurement.

The acoustic layer 43 or the protection film 44 causes an ultrasonic wave transmitted from the ultrasonic transducer 45 to propagate through a living body which is a measurement target with high efficiency, and causes an ultrasonic wave reflected inside the living body to propagate through the ultrasonic transducer 45 with high efficiency. Thus, acoustic impedance of the acoustic layer 43 and the protection film 44 is set to a value similar to acoustic impedance of the living body.

Operations and Effects of First Embodiment

In the ultrasonic device 22 of the first embodiment configured as described above, the following effects can be achieved.

The conductive film 52 has the notch 523 which is provided over the sealing plate 42 from an upper part of the resin section 51 and partially exposes the end part 511A of the bottom 511 of the resin section 51. In other words, the notch 523 partially overlaps the boundary between the resin section 51 and the sealing plate 42.

Here, the coating section 521 of the conductive film 52 is elastically deformed along with the resin section 51, but the extraction section 522 is fixed to the sealing plate 42. Thus, there is a difference in a deformation amount between the coating section 521 and the extraction section 522, and thus stress acts on a position overlapping the end part 511A (a boundary between the resin section 51 and the sealing plate 42) in the conductive film 52 due to this difference. In contrast, it is possible to alleviate the stress with the notch 523 formed at the position overlapping the end part 511A on which the stress easily acts. Therefore, it is possible to suppress the occurrence of a crack in the conductive film 52 and, further, to improve connection reliability.

The notch 523 can easily deform the coating section 521 on the resin section 51 when the resin section 51 is elastically deformed, and thus it is possible to alleviate stress acting on the connection between the coating section 521 and the extraction section 522.

Here, there is concern that external force applied to the ultrasonic device 22 during use of the ultrasonic probe 2 may act on the sealing plate 42. Even in this case, as described above, the notch 523 is formed at the position overlapping the boundary between the sealing plate 42 and the resin section 51, and thus it is possible to alleviate stress acting on the connection between the coating section 521 and the extraction section 522. Therefore, during use, it is also possible to suppress the occurrence of a crack in the conductive film 52 and, further, to improve connection reliability.

The notch 523 overlaps the boundary between the resin section 51 and the sealing plate 42, and exposes a part of the boundary. Consequently, the exposed portion on which the conductive film 52 is not formed in the resin section 51 can be easily deformed during elastic deformation of the resin section 51. Therefore, it is possible to alleviate stress acting on the conductive film 52 due to elastic deformation.

The conductive film 52 has the outer peripheral edge 524 which extends from the resin section 51 to the sealing plate 42. In other words, the resin section 51 has the X side end part 514 which is located further outward than the outer peripheral edge 524, and is exposed from the conductive film 52. The X side end part 514 is more easily elastically deformed than the central part 515 covered with the coating section 521.

The notch 523 is formed in a depressed shape so as to be directed from the outside inward at the position close to the X side end part 514 which is easily elastically deformed, that is, at the outer peripheral edge 524 of the conductive film 52 in the X direction (refer to FIG. 7). Therefore, as described above, it is possible to suppress the concentration of the stress on the conductive film 52 due to deformation of the resin section 51 and thus to prevent the occurrence of a crack in the conductive film 52.

A dimension of the conductive film 52 in the X direction is smaller than that of the resin section 51. In this configuration, the resin section 51 has the X side end parts 514 which are easily deformed toward both sides thereof in the width direction. The notches 523 are also formed at the outer peripheral edge 524 on both sides of the resin section 51 in the width direction (X direction). In this configuration, the resin section 51 can be deformed toward both sides thereof in the width direction. Therefore, an amount of the deformed resin section 51 can be distributed, and stress on the conductive film 52 can be distributed.

The notch 523 has an increasing width as becoming distant from the intersection 525 along the end part 511A. Specifically, in the present embodiment, a distance between the first edge part 521A and the end part 511A increases as a distance from the intersection 525 becomes longer. In this configuration, a width of the notch 523 increases as a distance from the intersection 525 becomes longer, and thus the resin section 51 is more easily deformed. Therefore, an amount of the deformed resin section 51 can be reduced as a distance from the intersection 525 becomes shorter, and thus it is possible to further alleviate stress acting on the conductive film 52 due to elastic deformation of the resin section 51.

A distance between the second edge part 522A and the end part 511A increases as a distance from the intersection 525 becomes longer. Therefore, even if the resin section 51 is elastically deformed so as to protrude in the Y direction, interference between the extraction section 522 and the resin section 51 can be reduced, and thus it is possible to prevent stress from acting on the conductive film 52 due to the interference.

The notch 523 is formed of the first edge part 521A and the second edge part 522A which are substantially linear and intersect each other at the intersection 525. In this configuration, a width (area) of the intersection 525 side can be made smaller than in a case where the notch 523 has, for example, a substantially rectangular shape. Therefore, it is possible to prevent a reduction in the strength of the conductive film 52 or an increase in a resistance value due to a larger notch being formed.

Second Embodiment

Hereinafter, a second embodiment will be described.

In the first embodiment, the notch 523 is formed in a substantially triangular shape by the substantially linear first edge part 521A and second edge part 522A. In contrast, the second embodiment is fundamentally different from the first embodiment in that a notch is formed of the first edge part 521A and the second edge part 522A which are curved in an arc shape.

In the following description, the same constituent elements as those in the first embodiment are given the same reference numerals, and description thereof will be omitted or will be made briefly.

Figure 8:
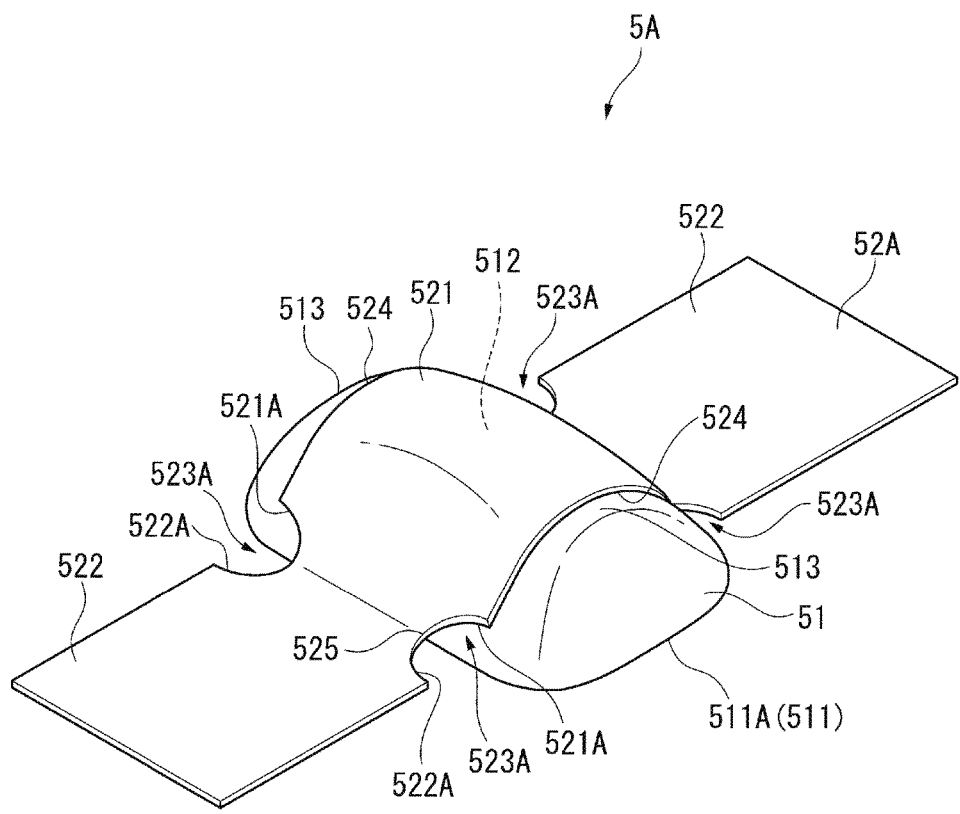
FIG. 8 is a perspective view illustrating a schematic configuration of a conduction portion in an ultrasonic device according to a second embodiment.

FIG. 8 is a perspective view illustrating a schematic configuration of a conduction portion 5A of the second embodiment.

As illustrated in FIG. 8, a conductive film 52A of the conduction portion 5A includes a coating section 521, an extraction section 522, and a notch 523A.

In the second embodiment, the notch 523A is curved to be depressed inward in the X direction, and is formed in a substantially arc shape. In other words, the first edge part 521A on the coating section 521 side is curved in a substantially arc shape. In this configuration, an amount of the exposed resin section 51 is larger than in a case where the first edge part 521A is substantially linear.

The second edge part 522A on the extraction section 522 side is curved in a substantially arc shape. Consequently, the second edge part 522A of the extraction section 522 can be separated from the resin section 51 or the coating section 521 more than in a case where the second edge part 522A is substantially linear.

Operations and Effects of Second Embodiment

In the second embodiment, the following operations and effects can be achieved in addition to the same operations and effects as those in the first embodiment.

Since the first edge part 521A forming the notch 523A has an arc shape and does not have a bent part on which stress easily concentrates, it is possible to prevent stress from concentrating on apart of the outer periphery of the conductive film 52.

The notch 523A is depressed toward the intersection 525, and thus a size of the notch 523A can be increased, for example, compared with a case where each of the edge parts 521A and 522A are formed to be substantially linear. Consequently, an amount of the exposed resin section 51 can be increased so that the exposed part can be easily deformed, and thus it is possible to further alleviate stress acting on the conductive film 52 due to elastic deformation of the resin section 51. A distance between each of the edge parts 521A and 522A and the end part 511A can be further increased, and thus it is possible to prevent interference between the coating section 521 and the extraction section 522.

Third Embodiment

Hereinafter, a third embodiment will be described.

In the first embodiment, the notch 523 is formed in a substantially triangular shape. In contrast, the third embodiment is fundamentally different from the first embodiment in that a notch is formed in a substantially rectangular shape.

In the following description, the same constituent elements as those in the first embodiment are given the same reference numerals, and description thereof will be omitted or will be made briefly.

Figure 9:
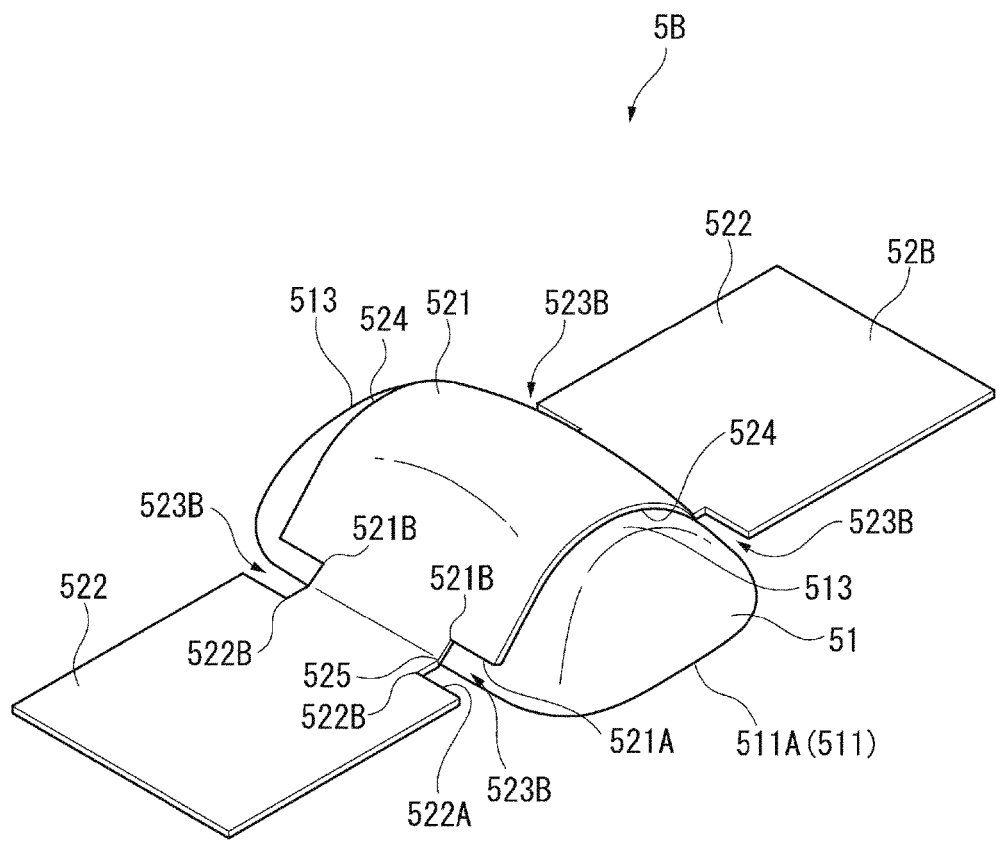
FIG. 9 is a perspective view illustrating a schematic configuration of a conduction portion in an ultrasonic device according to a third embodiment.

FIG. 9 is a perspective view illustrating a schematic configuration of a conduction portion 5B of the third embodiment.

As illustrated in FIG. 9, a conductive film 52B of the conduction portion 5B includes a coating section 521, an extraction section 522, and a notch 523B.

In the third embodiment, the notch 523B is depressed inward in the X direction, and is formed in a substantially rectangular shape. In other words, the first edge part 521A on the coating section 521 side rises along the resin section 51 toward the +Z side on the inner surface 42A, and is bent in the X direction along the resin section 51 at a bent part 521B. In this configuration, an amount of the exposed resin section 51 is larger than in a case where the first edge part 521A is substantially linear. The first edge part 521A can be further separated from the extraction section 522.

The second edge part 522A on the extraction section 522 side extends from the end part 511A along the inner surface 42A in the Y direction, and is bent at a bent part 522B in the X direction. Consequently, the second edge part 522A of the extraction section 522 can be separated from the resin section 51 or the coating section 521 more than in a case where the second edge part 522A is substantially linear.

Operations and Effects of Third Embodiment

In the third embodiment, the following operations and effects can be achieved in addition to the same operations and effects as those in the first embodiment.

The first edge part 521A forming the notch 523B has the bent part 521B. Thus, in the conductive film 52, stress easily acts not only the intersection 525 but also on the bent part 521B. Therefore, the stress acting on the conductive film 52 can be distributed, and thus it is possible to prevent the occurrence of a crack in the conductive film 52 due to the stress concentration.

The first edge part 521A has the bent part 521B on the resin section 51 as described above. In this configuration, an amount of the exposed resin section 51 can be made larger than in a case where the first edge part 521A is substantially linear, and thus the exposed part of the resin section 51 can be easily deformed. Thus, it is possible to further alleviate stress acting on the conductive film 52 due to elastic deformation of the resin section 51. A distance between each of the edge parts 521A and 522A and the end part 511A can be further increased, and thus it is possible to prevent interference between the coating section 521 and the extraction section 522.

Fourth Embodiment

Hereinafter, a fourth embodiment will be described.

In the first to third embodiments, the conductive film is provided with the notch exposing a part of the end part 511A of the resin section 51. The fourth embodiment is fundamentally different from the first to third embodiments in that a second notch is formed around the top part 512.

In the following description, the same constituent elements as those in the first embodiment are given the same reference numerals, and description thereof will be omitted or will be made briefly.

Figure 10:
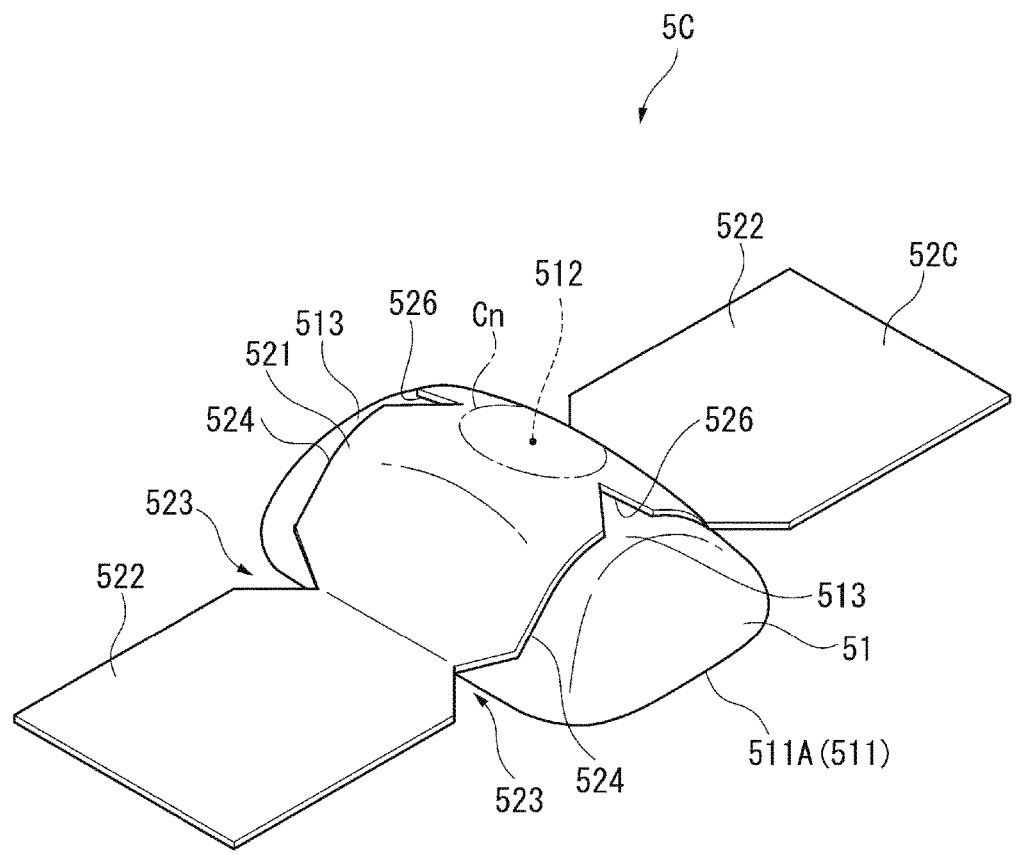
FIG. 10 is a perspective view illustrating a schematic configuration of a conduction portion in an ultrasonic device according to a fourth embodiment.

FIG. 10 is a perspective view illustrating a schematic configuration of a conduction portion 5C of the fourth embodiment.

A conductive film 52C includes a coating section 521, an extraction section 522, a notch 523, and a second notch 526. The conductive film 52C is in contact with the wiring portion 415 so as to be electrically connected thereto in the connection region Cn overlapping the top part 512.

The second notch 526 is located around the connection region Cn of the coating section 521 and is located on the inclined part 513, and is formed to be depressed toward the connection region Cn. In the present embodiment, the second notch 526 is provided at a part of the outer peripheral edge 524, and is formed to be depressed toward the connection region Cn from the outside of the coating section 521 when viewed from the Z direction. The second notch 526 is formed so that a width thereof in the Y direction is reduced inward of the coating section 521. For example, the second notch 526 is formed in a substantially triangular shape by a pair of edge parts which are substantially linear toward the connection region Cn from the outer peripheral edge when viewed from the Z direction and intersect each other around the connection region Cn.

Operations and Effects of Fourth Embodiment

In the fourth embodiment, the following operations and effects can be achieved in addition to the same operations and effects as those in the first embodiment.

The second notch 526 is located around the connection region Cn. Here, the conduction portion 5C receives pressing force at the position overlapping the connection region Cn so as to be elastically deformed. At this time, a difference in an amount of the exposed resin section 51 occurs between the position overlapping the connection region Cn and the vicinity thereof. There is concern that stress may act on the conductive film 52C due to the difference in the deformation amount, and thus a crack may occur therein. In contrast, the second notch 526 can alleviate the stress acting on the conductive film 52C and can thus prevent the occurrence of a crack in the conductive film 52C.

The resin section 51 has the inclined part 513 which is inclined from the top part 512 toward the sealing plate 42, and at least a part of the outer peripheral edge 524 of the conductive film 52C is located on the inclined part 513. In other words, the end part 511A of the resin section 51 is located outside the outer peripheral edge 524 of the conductive film 52C, and is thus more easily deformed than the location where the conductive film 52C is provided. Therefore, stress easily concentrates on the outer peripheral edge 524 of the conductive film 52C due to a difference in a deformation amount of the resin section 51 between the inside and the outside of the outer peripheral edge 524 of the conductive film 52C. The stress also easily concentrates on the outer peripheral edge 524 of the conductive film 52C located on the inclined part 513 due to the above-described difference in a deformation amount between the position overlapping the connection region Cn and the vicinity thereof.

In contrast, the second notch 526 is formed to be depressed inward at the outer peripheral edge 524 located on the inclined part 513. Thus, the coating section 521 provided on the resin section 51 can be easily deformed, and thus it is possible to alleviate stress acting on the conductive film 52C.

Modification Examples of Fourth Embodiment

Figure 11:
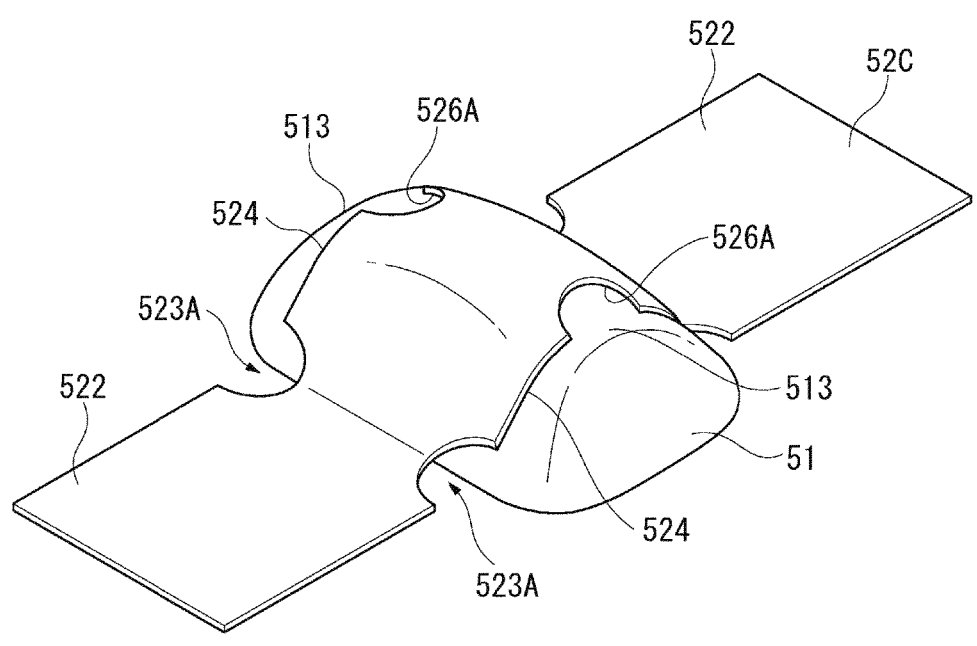
FIG. 11 is a perspective view illustrating a schematic configuration of a conduction portion in an ultrasonic device according to a modification example of the fourth embodiment.
Figure 12:
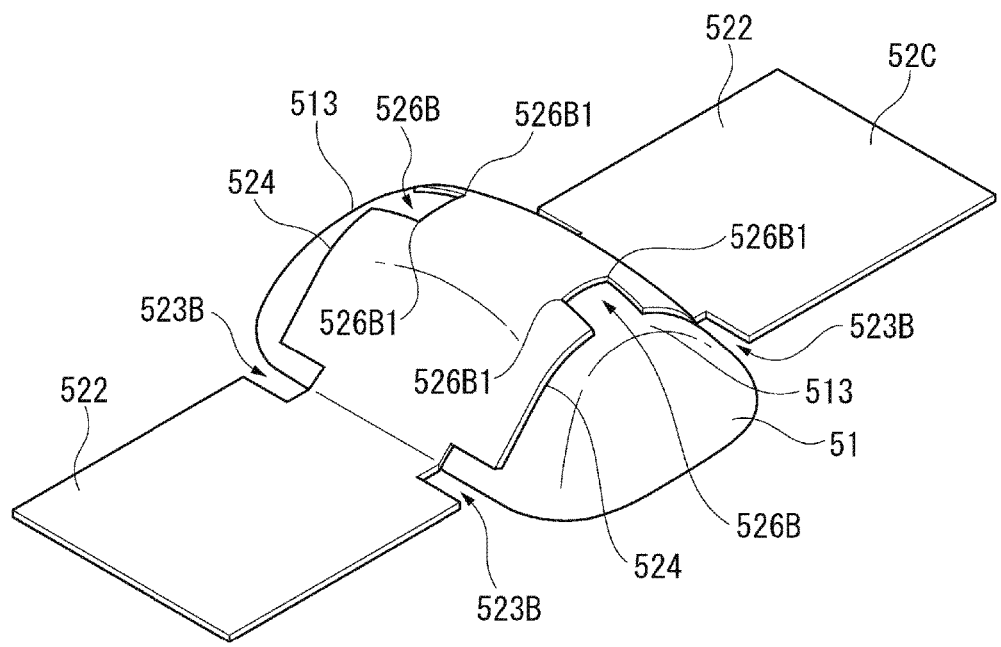
FIG. 12 is a perspective view illustrating a schematic configuration of a conduction portion in an ultrasonic device according to another modification example of the fourth embodiment.

FIGS. 11 and 12 are perspective views illustrating schematic configurations of conduction portions related to modification examples of the fourth embodiment.

In the fourth embodiment, the second notch 526 is formed in a substantially triangular shape by a pair of edge parts which are substantially linear toward the connection region Cn from the outer peripheral edge when viewed from the Z direction, and intersect each other around the connection region Cn. In contrast, a shape of the second notch is not limited to the fourth embodiment.

In a modification example illustrated in FIG. 11, a second notch 526A is formed of an edge part which is curved to be depressed toward the connection region Cn. In this configuration, an area of the second notch 526A can be increased more than in a case of being formed of a linear edge part. Consequently, an amount of the exposed resin section 51 can be increased so that the exposed part can be easily deformed, and thus it is possible to further alleviate stress acting on the conductive film 52C due to elastic deformation of the resin section 51. The edge part of the second notch 526A is curved and does not have a bent part on which stress easily concentrates, and thus it is possible to prevent stress from concentrating on a part of the conductive film 52C.

In a modification example illustrated in FIG. 12, a second notch 526B is formed to be depressed toward the connection region Cn in a substantially rectangular shape. In other words, the second notch 526B has two bent parts 526B1. In the second notch 526B, stress can be distributed to each bent part compared with a configuration in which a single bent part is provided as in the second notch 526 of the fourth embodiment. Therefore, it is possible to more reliably prevent the occurrence of a crack in the conductive film 52C due to stress concentration. The number of the second notch bent parts is not limited to one or two, and may be three or more.

In FIG. 10, a configuration in which the substantially triangular notch 523 is provided, in FIG. 11, a configuration in which the arc-shaped notch 523A is provided, and, in FIG. 12, a configuration in which the substantially rectangular notch 523B is provided have been exemplified, but each configuration is only an example. In other words, in the configuration of the fourth embodiment illustrated in FIG. 10, instead of the triangular notch 523, notches having other shapes (the arc-shaped notch 523A or the rectangular notch 523B) may be used. This is also the same for the examples illustrated in FIGS. 11 and 12.

Fifth Embodiment

Hereinafter, a fifth embodiment will be described.

In the first embodiment, the conduction portion 5 is provided with the resin section 51 having the inclined part 513 which is inclined from the top part 512 toward the sealing plate 42, and the conductive film 52 whose outer peripheral edge 524 is located on the inclined part 513. In contrast, the fifth embodiment is different from the first embodiment in that a resin section is formed in a substantially half-cylindrical shape, and a conductive film is formed to cross over the resin section along a diameter direction of the half-cylinder.

In the following description, the same constituent elements as those in the first embodiment are given the same reference numerals, and description thereof will be omitted or will be made briefly.

Configuration of Ultrasonic Device

Figure 13:
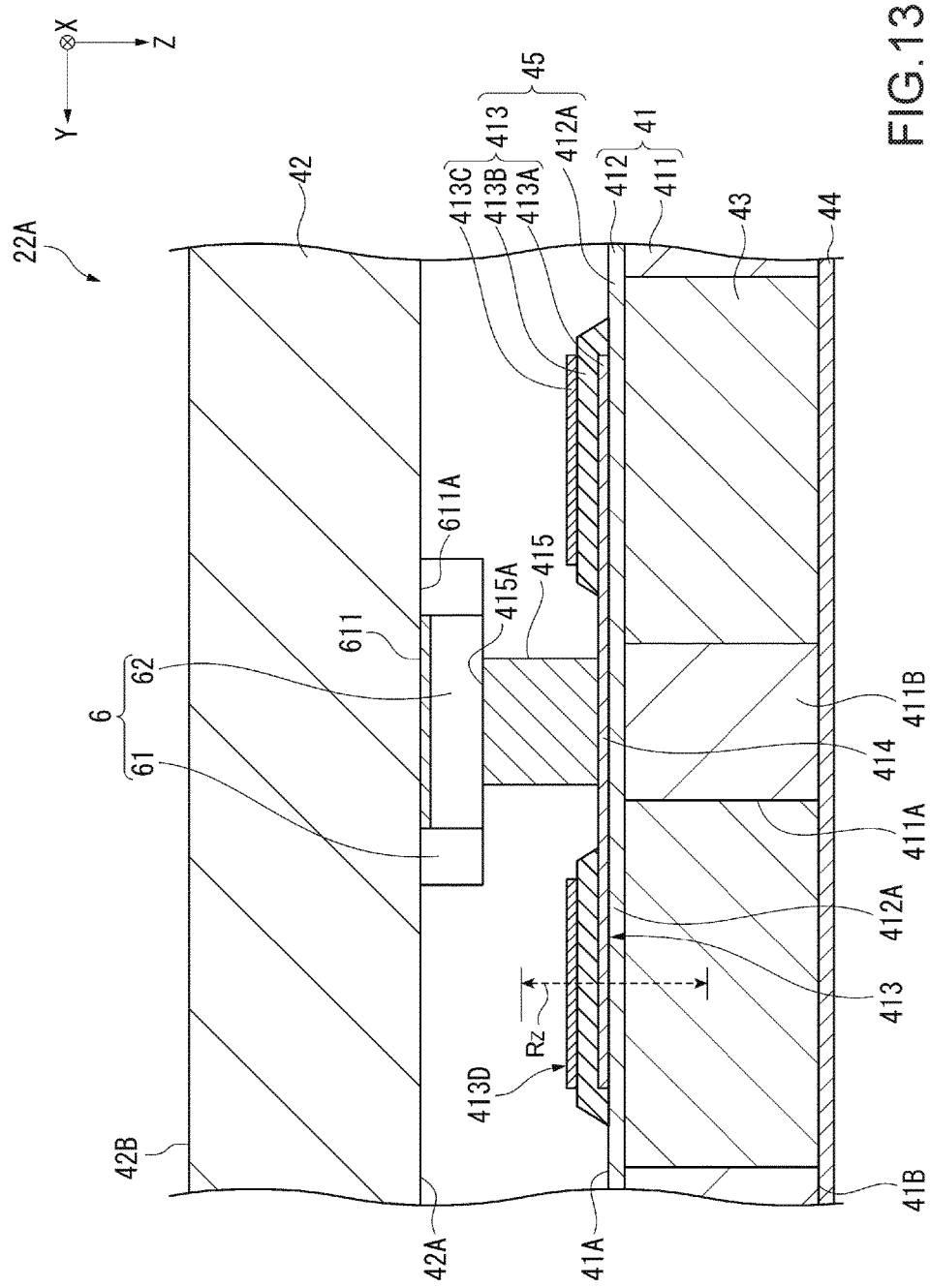
FIG. 13 is a sectional view illustrating a schematic configuration of an ultrasonic device according to a fifth embodiment.
Figure 14:
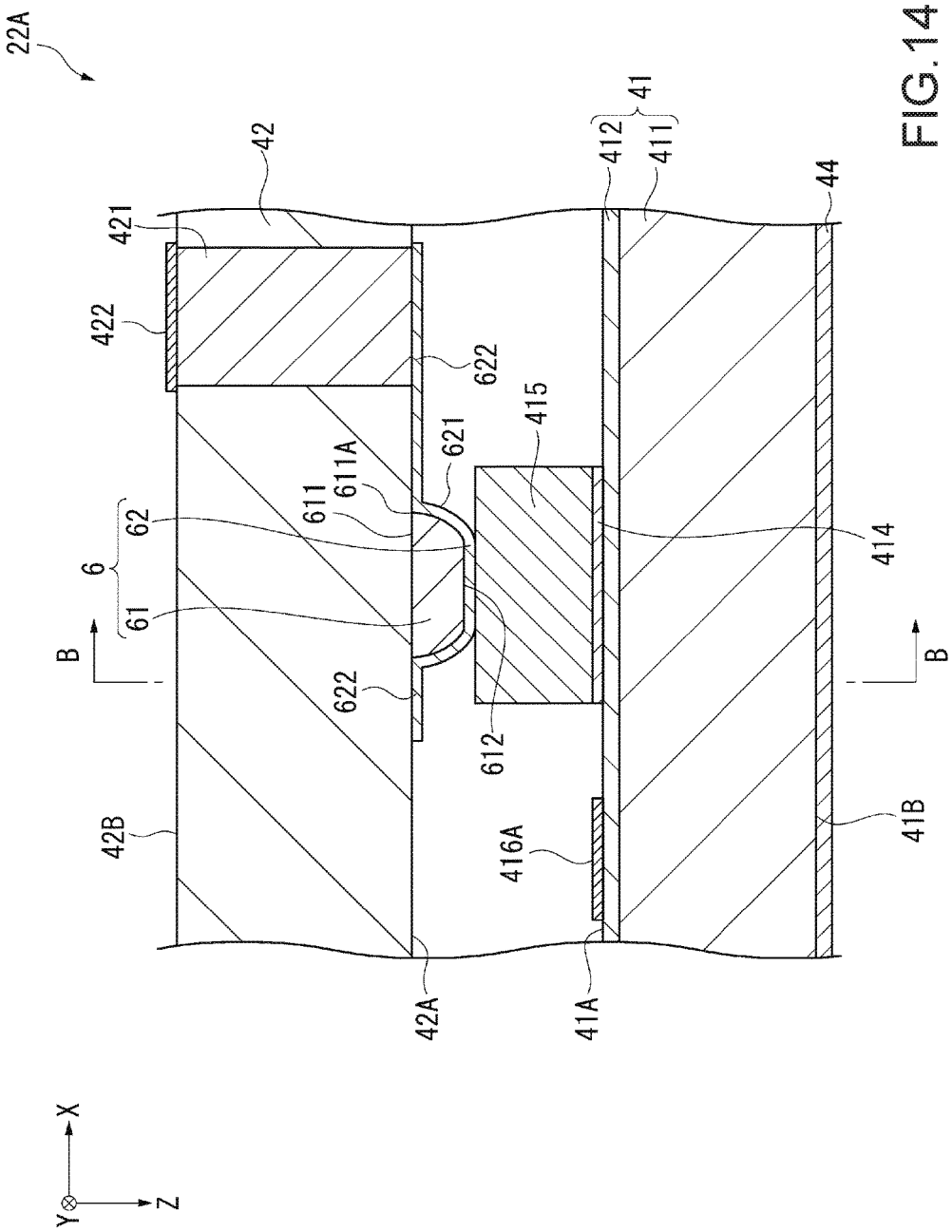
FIG. 14 is a sectional view illustrating a schematic configuration of the ultrasonic device according to the fifth embodiment.
Figure 15:
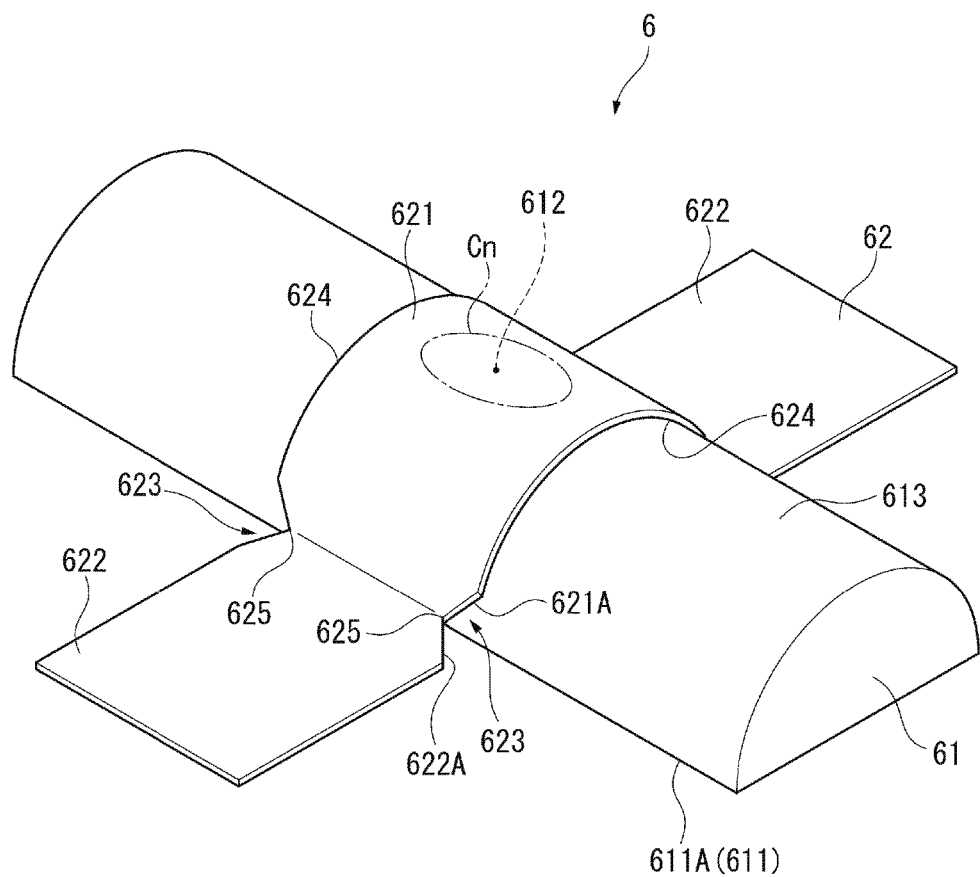
FIG. 15 is a perspective view illustrating a schematic configuration of a conduction portion in the ultrasonic device according to the fifth embodiment.

FIG. 13 is a sectional view illustrating a schematic configuration of main portions of an ultrasonic device according to the fifth embodiment. FIG. 14 is a sectional view illustrating a schematic configuration of main portions of the ultrasonic device according to the fifth embodiment in FIG. 13. FIG. 15 is a perspective view schematically illustrating a conduction portion of the ultrasonic device according to the fifth embodiment. FIG. 13 is a sectional view of the ultrasonic device 22A taken along the line B-B in FIG. 14.

As illustrated in FIGS. 13 and 14, in an ultrasonic device 22A of the fifth embodiment, a conduction portion 6 is provided on the sealing plate 42. The conduction portion 6 is in contact with the wiring portion 415 on the element substrate 41 side so as to be electrically connected thereto. Consequently, the lower electrode 413A of the piezoelectric element 413 of the ultrasonic transducer 45 is electrically connected to the circuit substrate 23 via the wiring portion 415, the conduction portion 6, the through electrode 421, the lower electrode wire 422, and the like.

In the fifth embodiment, as illustrated in FIG. 14, a configuration in which a single through electrode 421 is provided with respect to a single conduction portion 6, but the number or an arrangement position of the through electrode 421 is not limited to the configuration in the fifth embodiment.

The conduction portion 6 has the Y direction as a lid opening/closing device, and is provided on the inner surface 42A of the sealing plate 42 so as to intersect the wiring portion 415 in a plan view in the Z direction. The conduction portion 6 includes a resin section 61 and a conductive film which covers a part of the resin section 61 and is electrically connected to the through electrode 421.

As illustrated in FIG. 15, the resin section 61 is formed by using an elastic resin material, has the Y direction as a lid opening/closing device, and is formed in a substantially half-cylindrical shape whose ZX section is a semicircular shape before being elastically deformed. The resin section 61 has a bottom 611 which is in contact with the sealing plate 42, a top part 612 overlapping a connection region with the wiring portion 415, and an equal-thickness part 613 on which the conductive film 62 is provided.

The equal-thickness part 613 is formed in the substantially entire region of the resin section 61 in the Y direction (one direction), and a sectional shape thereof in the ZX plane is substantially the same regardless of a position in the Y direction before being elastically deformed. In other words, the equal-thickness part 613 has a dimension (thickness dimension) in the Z direction (a thickness direction of the sealing plate 42) which does not almost vary along the Y direction. The conductive film 62 is provided to cross over the equal-thickness part 613.

A ZX section of the resin section 61 is not limited to a substantially semicircular shape, and may be a substantially trapezoidal shape (a state in which corners of a trapezoidal are rounded).

The conductive film 62 has a coating section 621, an extraction section 622, and a notch 623, and is provided to cross over the resin section 61 in the X direction (an intersection direction intersecting one direction) by using the same conductive material as in the first embodiment. The conductive film 62 has a dimension (width dimension) in the Y direction (width direction) smaller than that of the resin section 61. Thus, the conductive film 62 has outer peripheral edges 624 which extend from the resin section 61 to the inner surface 42A of the sealing plate 42 on the ±Y sides.

The coating section 621 is provided at at least a position overlapping the wiring portion 415 on the resin section 61. A dimension of the conductive film 62 in the Y direction is larger than that of the wiring portion 415 on the resin section 61. The coating section 621 is provided on the equal-thickness part 613 whose thickness dimension does not almost vary along the Y direction in the resin section 61.

The extraction sections 622 are extracted from the respective end parts of the coating section 621 on the ±X sides along the X direction. The extraction section 622 on the +X side is extracted to the formation position of the through electrode 421, and is thus connected to the through electrode 421.

As illustrated in FIG. 15, the notch 623 is provided over the coating section 621 and the extraction section 622, and partially exposes an end part 611A which is a boundary between the resin section 61 and the sealing plate 42. The notch 623 is provided from the outside of the conductive film 62 inward along the Y direction at the boundary (a position overlapping the end part 611A when viewed from the Z direction) between the coating section 621 and the extraction section 622 in the conductive film 62 provided along the X direction. The notches 623 are provided on both sides of the conductive film 62 in the Y direction.

In the same manner as the notch 523 of the first embodiment, the notch 623 is formed in a substantially triangular shape by a first edge part 621A on the coating section 621 side and a second edge part 622A on the extraction section 622 side. In other words, the notch 623, which is provided at the outer peripheral edge 624, is formed to be depressed from the outside of the conductive film 62 inward when viewed from a thickness direction (for example, the Z direction) of the conductive film 62, and partially exposes the end part 611A. The notch 623 has increasing width as a distance from an intersection 625 between the edge parts 621A and 622A becomes longer along the end part 611A. In other words, the first edge part 621A and the second edge part 622A are separated from the end part 611A as a distance from the intersection 625 becomes longer. Consequently, an amount of the exposed resin section 61 increases as a distance from the intersection 625 becomes longer.

The conduction portion 6 configured as mentioned above is brought into pressure contact with the wiring portion 415. In other words, a connection region Cn overlapping the top part 612 of the resin section 61 is pressed against the wiring portion 415. Consequently, the resin section 61 and the conductive film 62 are elastically deformed. At this time, the conduction portion 6 is brought into close contact with the wiring portion 415 by elastic force. As mentioned above, the wiring portion 415 can be brought into close contact with the conduction portion 6 by the elastic force of the conduction portion 6, and thus it is possible to improve connection reliability.

Operations and Effects of Fifth Embodiment

In the fifth embodiment, the following operations and effects can be achieved in addition to the same operations and effects as those in the first embodiment.

The coating section 621 is provided on the resin section 61 having a substantially half-cylindrical shape. In other words, as described above, the coating section 621 is provided on the equal-thickness part 613 whose thickness does not vary along the Y direction. Thus, the resin section 61 is pressed substantially uniformly from the wiring portion 415 in the Y direction in the connection region Cn. Therefore, it is possible to reduce a difference in a deformation amount of the resin section 61 in the connection region Cn, and further to reduce a deformation amount of the conductive film 62, compared with a case where the resin section 51 has the inclined part 513, and a thickness of the top part 512 is the maximum as in the first embodiment. Therefore, it is possible to alleviate stress acting on the conductive film 62 in the connection region Cn or the vicinity thereof due to the difference in a deformation amount, and thus to prevent the occurrence of a crack in the conductive film 62. Since the stress can be alleviated even if a notch is not provided in the vicinity of the connection region Cn, a configuration of the conduction portion 6 can be simplified.

The wiring portion 415 and the conductive film 62 of the conduction portion 6 intersect each other in a plan view in the Z direction. A dimension of the conductive film 62 in the Y direction is larger than that of the wiring portion 415. Consequently, in the ultrasonic device 22A, positional deviation between the element substrate 41 and the sealing plate 42 can be allowed during wiring connection, and thus it is possible to prevent the occurrence of a connection defect. In other words, in a case where the wiring portion 415 and the conduction portion 6 do not intersect each other in the plan view, an area of the connection position may be reduced and thus contact resistance may increase due to a positional deviation between the element substrate 41 and the sealing plate 42. Appropriate electrical connection may be not performed due to the positional deviation. In contrast, the wiring portion 415 and the conduction portion 6 are disposed to intersect each other, and thus an allowable amount for the positional deviation can be increased. Thus, positioning between the element substrate 41 and the sealing plate 42 can be easily performed, and wiring connection can also be performed. It is possible to improve connection reliability.

Modification Examples of Fifth Embodiment

Figure 16:
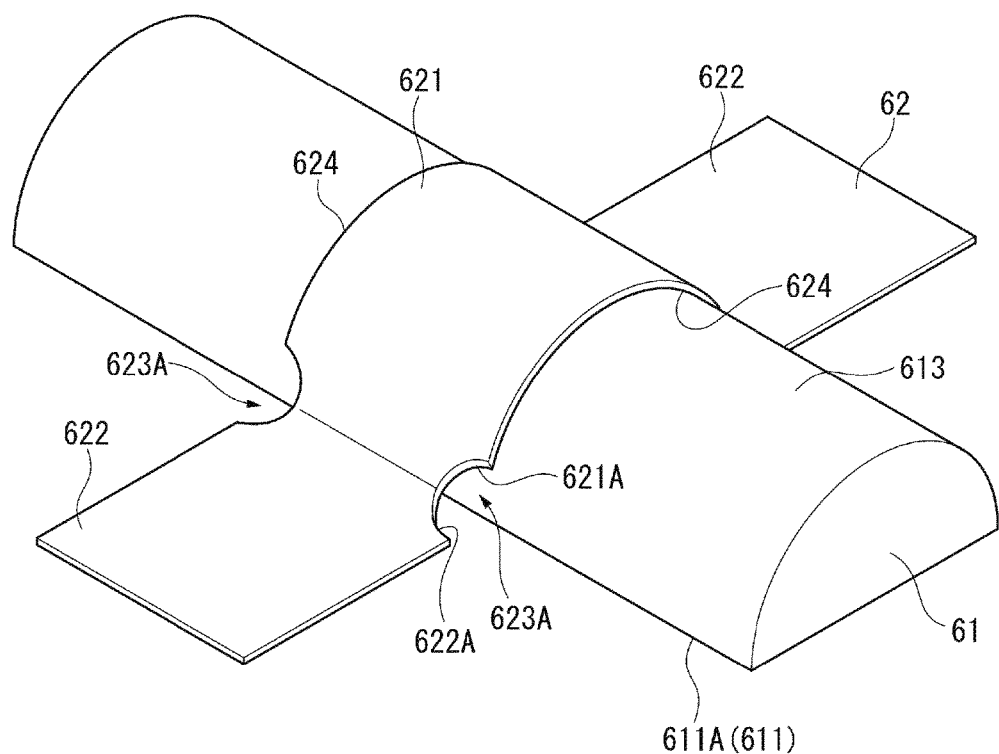
FIG. 16 is a perspective view illustrating a schematic configuration of a conduction portion in an ultrasonic device according to a modification example of the fifth embodiment.
Figure 17:
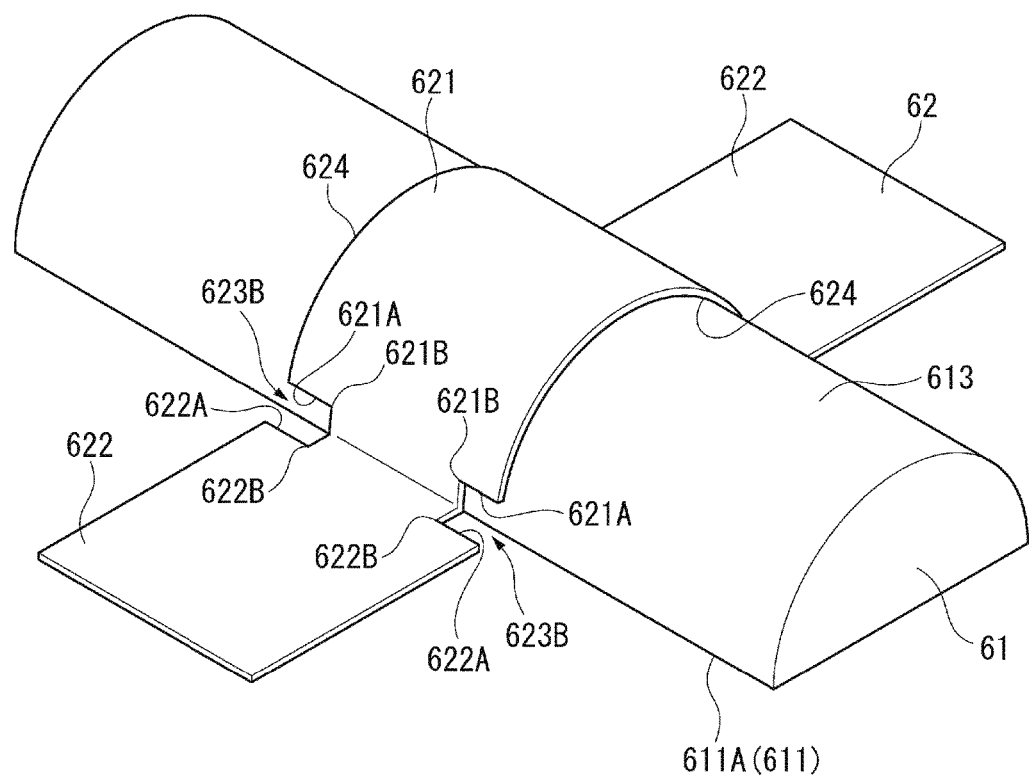
FIG. 17 is a perspective view illustrating a schematic configuration of a conduction portion in an ultrasonic device according to another modification example of the fifth embodiment.

FIGS. 16 and 17 are perspective views illustrating schematic configurations of conduction portions related to modification examples of the fifth embodiment.

In the fifth embodiment, the notch 623 is formed in a substantially triangular shape by a pair of edge parts 621A and 622A intersecting each other at the intersection 625 when viewed from the Z direction. In contrast, a shape of the notch is not limited to the fifth embodiment.

In a modification example illustrated in FIG. 16, a notch 623A is curved to be depressed inward in the Y direction, and is formed in a substantially arc shape in the same as the notch 523A of the second embodiment.

In other words, the first edge part 621A on the coating section 621 side is curved in a substantially arc shape. In this configuration, an amount of the exposed resin section 61 is larger than in a case where the first edge part 621A is substantially linear, and thus the exposed portion can be more easily deformed. It is possible to prevent stress from concentrating on a part of the first edge part 621A.

The second edge part 622A on the extraction section 622 side is curved in a substantially arc shape. Consequently, the second edge part 622A of the extraction section 622 can be separated from the resin section 61 or the coating section 621 more than in a case where the second edge part 622A is substantially linear.

In a modification example illustrated in FIG. 17, a notch 623B is depressed inward in the Y direction, and is formed in a substantially rectangular shape, in the same manner as the notch 523B of the third embodiment.

In other words, the first edge part 621A on the coating section 621 side rises along the resin section 61 toward the +Z side, and is bent in the Y direction at a bent part 621B so as to be formed in a substantially rectangular shape. In this configuration, an amount of the exposed resin section 61 is larger than in a case where the first edge part 621A is substantially linear, and thus the exposed portion can be more easily deformed. The bent part 621B is formed, and thus stress can be distributed.

The second edge part 622A on the extraction section 622 side is formed in a substantially rectangular shape. In other words, the second edge part 622A extends from the end part 611A in the X direction, and is bent at a bent part 622B in the Y direction so as to be formed in a substantially rectangular shape. Consequently, the second edge part 622A of the extraction section 622 can be separated from the resin section 61 or the coating section 621 more than in a case where the second edge part 622A is substantially linear.

In the configurations illustrated in FIGS. 15 to 17, a second notch may be further provided. In other words, if a second notch is provided around the connection region Cn, the coating section 621 can be easily deformed, and thus it is possible to further alleviate stress acting on the coating section 621. In the respective configurations illustrated in FIGS. 15 to 17, as the second notch, anyone of the substantially triangular notches illustrated in FIG. 15, the arc-shaped notch illustrated in FIG. 16, and the substantially rectangular notch illustrated in FIG. 17 may be formed.

Modification Examples

The invention is not limited to the above-described embodiments, and configurations obtained through modifications, alterations, and combinations of the respective embodiments as appropriate within the scope capable of achieving the object of the invention are included in the invention.

In the above-described respective embodiments, the conductive film is configured to have a width dimension smaller than that of the resin section (core section) and to cover a part of the resin section, but is not limited thereto. For example, there may be a configuration in which the entire core section is covered with the conductive film except for a position where a notch is formed. More specifically, in the above-described embodiments, a width dimension of the conductive film may be larger than that of the resin section (core section). Also in this configuration, a notch is formed to partially expose an end part of the core section, and thus it is possible to alleviate stress acting on the conductive film.

In the first embodiment, a configuration has been exemplified in which the conductive film is provided to cross over the resin section in the Y direction, the resin section having the X direction as a longitudinal direction, but this is only an example. The conductive film may be provided to cross over the resin section in the X direction. The resin section may be formed in a substantially hemispherical shape, and the conductive film may be formed to cover at least a part of the resin section. In this configuration, a second notch may be further provided around a top part of the resin section.

In the above-described respective embodiments, a configuration has been exemplified in which a plurality of notches having the same shape are formed in the conductive film, but this is only an example, and there may be a configuration in which notches having different shapes are formed.

In the above-described respective embodiments, a configuration has been exemplified in which four notches are formed in the conductive film. For example, in the first embodiment, a pair of notches are formed on both sides of the conductive film in the width direction, and a pair of notches are formed on both sides of the resin section in the direction intersecting the width direction. However, this is only an example, and there may be a configuration in which notches of one or more and three or less are formed in the conductive film. In other words, there may be a configuration in which a notch is formed at any one of the four formation positions of the notches.

In the above-described respective embodiments, a configuration has been exemplified in which the notch is formed to be depressed from the outside inward at the outer peripheral edge of the conductive film, but this is only an example. For example, the notch may be formed further inward than the outer peripheral edge of the conductive film. Also in this configuration, the notch is formed to partially expose an end part of the resin section (core section), and thus it is possible to alleviate stress acting on the conductive film as described above.

In the above-described respective embodiments, a configuration has been exemplified in which shapes of the first edge part and the second edge part forming the notch are the same as each other. In other words, in a case where the first edge part is substantially linear, the second edge part is also substantially linear, and, in a case where the first edge part has a substantially arc shape, the second edge part also has a substantially arc shape. However, this is only an example, and the first edge part and the second edge part may have different shapes. For example, the first edge part may be formed in a substantially arc shape, and the second edge part maybe formed in a substantially linear shape or a substantially rectangular shape.

In the above-described respective embodiments, the core section made of an elastic resin material has been exemplified, but is not limited thereto. For example, the core section may be formed by using a metal material such as lead or a solder having a relatively small Young's modulus. Also in this configuration, it is possible to alleviate stress acting on the conductive film due to deformation of the core section.

In the above-described respective embodiments, the wiring portion may be configured to include a coating section which coats the wiring portion. The coating section is formed by using a material such as Au having a relatively high electric conductivity, and thus it is possible to reduce contact resistance between the wiring portion and the conduction portion. In a case where of a conductive film and a coating section of the conduction portion are formed by using Au, it is possible to improve connection reliability through diffusion bonding between Au layers.

In the above-described respective embodiments, a configuration has been exemplified in which the wiring portion is rectangular, and protrudes toward the sealing plate 42 side from the element substrate 41. However, the wiring portion is not limited to the configuration, and may be, for example, a conductive film formed on the element substrate 41. In other words, the wiring portion may be configured to be thinner than a functional element such as a piezoelectric element and not to protrude toward the sealing plate 42 side.

In the above-described respective embodiments, the wiring portion on the element substrate 41 side is made of a conductive material such as metal. The conduction portion of the sealing plate 42 is configured to include the resin section and the metal film and to be able to be elastically deformed. However, the invention is not limited thereto, and, for example, the conduction portion may also be made of a conductive material such as metal. In a case where the conduction portion does not include an elastic material layer such as a resin section, the conduction portion preferably has an outer shape along a surface of the wiring portion so as to be able to be in close contact with the wiring portion. The wiring portion and the conduction portion may be configured to include resin sections and metal films and thus to be able to be elastically deformed.

In the above-described embodiments, the ultrasonic transducer group 45A which is a transmission/reception channel is formed of two ultrasonic transducers 45, but the ultrasonic transducer group 45A may be formed of three or more ultrasonic transducers 45. There may be a configuration in which the lower electrodes 413A of the respective ultrasonic transducers 45 are separate from each other, and thus each of the ultrasonic transducers 45 is individually driven. In this case, each ultrasonic transducer 45 may function as a single transmission/reception channel.

In the above-described respective embodiments, a description has been made of a two-dimensional array structure in which the ultrasonic transducer groups 45A each functioning as a single transmission/reception channel are disposed in a matrix in the array region Ar1 of the element substrate 41, but this is only an example. For example, the ultrasonic device may have a one-dimensional array structure in which a plurality of transmission/reception channels are disposed along one direction. For example, the ultrasonic transducer group 45A may be formed of a plurality of ultrasonic transducers 45 disposed along the X direction, and a plurality of ultrasonic transducer groups 45A are disposed in the Y direction so as to form the ultrasonic array UA having a one-dimensional array structure.

In the above-described respective embodiments, a description has been made of an example of a configuration in which the ultrasonic transducer 45 is formed of the vibration film 412 and the piezoelectric element 413 formed on the vibration film 412. For example, the ultrasonic transducer 45 may be configured to include a flexible portion, a first electrode provided on the flexible portion, and a second electrode provided at a position opposing the first electrode in a sealing plate. The first electrode and the second electrode form an electrostatic actuator as a vibrator. In this configuration, an ultrasonic wave can be transmitted by driving the electrostatic actuator, and an ultrasonic wave can be detected by detecting electrostatic capacitance between the electrodes.

In the above-described embodiments, an ultrasonic apparatus which measures an organ of a living body has been described as an example of an electronic apparatus, but the invention is not limited thereto. For example, the configurations of the above-described embodiments and respective modification examples may be applied to a measurement apparatus which measures various structural bodies, and detects a defect of a structural body or inspects aging thereof. This is also the same for a measurement apparatus which measures, for example, a semiconductor package or a wafer, and detects a defect of such a measurement target. This is also the same for a recording apparatus including an ink jet head which ejects ink droplets by driving a piezoelectric element.

In the above-described embodiments, a description has been made of an example of a configuration in which the ultrasonic transducer is provided on the element substrate, but the invention is not limited thereto. For example, the configurations of the embodiments and respective modification examples may be applied to a mounting structure including a first substrate provided with an electric component such as a semiconductor IC, that is, an functional element, and a second substrate electrically connected to the first substrate, or an image display device or an image forming device in which the mounting structure is provided in a casing. In other words, a wiring portion which is provided on the first substrate and is connected to the electric component and a conduction portion which is provided on the second substrate and is connected to the wiring portion are connected to each other further toward the second substrate side than the electric component, and thus it is possible to prevent interference between the functional element and the conduction portion and thus to appropriately and easily perform wiring connection between the first substrate and the second substrate.

A specific structure when the invention is implemented may be configured as appropriate by combining the respective embodiments and modification examples within the scope of being capable of achieving the object of the invention, and may be changed to other structures as appropriate.

The entire disclosure of Japanese Patent Application No. 2016-184362 filed Sep. 21, 2016 is expressly incorporated by reference herein.

What is claimed is:
1. A mounting structure comprising:
a first substrate having a first surface;

an elastic core upstanding from the first surface;
a conductive film continuously provided directly on the first surface, crossing over an outer surface of the core, and returning directly onto the first surface, the conductive film having a first side edge including a first notch and a second side edge including a second notch;
a second substrate having a second surface facing the first surface of the first substrate; and
a wiring on the second surface connected to the conductive film opposite the core,
wherein each of the first and second notches of the conductive film symmetrically spans an interfacial boundary of the first surface of the first substrate and the outer surface of the core, and
a line on a shortest distance between the first and second notches is aligned only with the interfacial boundary.

2. The mounting structure according to claim 1,
wherein the first and second notches are inwardly depressed from the first and second side edges of the conductive film in a plan view, respectively.

3. The mounting structure according to claim 1, wherein each of the first and second notches is configured with a first linear edge and a second linear edge, and
wherein the first linear edge and the second linear edge intersect on the interfacial boundary.

4. The mounting structure according to claim 2, wherein each of the first and second notches has an arc shape.

5. The mounting structure according to claim 1,
wherein each of the first and second edges of the conductive film has a bent on the core in a plan view.

6. The mounting structure according to claim 1,
wherein each of the first and second side edges of the conductive film has a plurality of the notches.

7. The mounting structure according to claim 1, wherein
a first distance between the first and second side edges of the conductive film in a first direction is shorter than a second distance between both edges of the core in the first direction.

8. The mounting structure according to claim 1,
wherein the core has a face at a constant height relative to the first surface, and
the conductive film is provided on the face.

9. The mounting structure according to claim 1,
wherein the first and second side edges of the conductive film have third and source notches, respectively, and
the wiring is directly connected to the third and fourth notches of the conductive film on the core.

10. The mounting structure according to claim 9,
wherein a cross-section of the core is a trapezpoid that has two opposite sides, the two opposite sides are one of inclined and curved.

11. An electronic apparatus comprising:
the mounting structure according to claim 1; and
an ultrasonic transducer that is provided on one of the first substrate and the second substrate.

12. An electronic apparatus comprising:
the mounting structure according to claim 2; and
an ultrasonic transducer that is provided on one of the first substrate and the second substrate.

13. An electronic apparatus comprising:
the mounting structure according to claim 3; and
an ultrasonic transducer that is provided on one of the first substrate and the second substrate.

14. An electronic apparatus comprising:
the mounting structure according to claim 4; and
an ultrasonic transducer that is provided on one of the first substrate and the second substrate.

15. An electronic apparatus comprising:
the mounting structure according to claim 5; and
an ultrasonic transducer that is provided on one of the first substrate and the second substrate.

16. An electronic apparatus comprising:
the mounting structure according to claim 6; and
an ultrasonic transducer that is provided on one of the first substrate and the second substrate.

17. An electronic apparatus comprising:
the mounting structure according to claim 7; and
an ultrasonic transducer that is provided on one of the first substrate and the second substrate.

18. An electronic apparatus comprising:
the mounting structure according to claim 8; and
an ultrasonic transducer that is provided on one of the first substrate and the second substrate.

19. An electronic apparatus comprising:
the mounting structure according to claim 9; and
an ultrasonic transducer that is provided on one of the first substrate and the second substrate.

20. An electronic apparatus comprising:
the mounting structure according to claim 10; and
an ultrasonic transducer that is provided on one of the first substrate and the second substrate.

* * * * *